(12) United States Patent
Shimokawa et al.

(10) Patent No.: US 8,431,324 B2
(45) Date of Patent: Apr. 30, 2013

(54) RADIATION-SENSITIVE RESIN COMPOSITION

(75) Inventors: Tsutomu Shimokawa, Tokyo (JP); Takuma Ebata, Tokyo (JP)

(73) Assignee: JSR Corporation, Tokyo (JP)

( * ) Notice: Subject to any disclaimer, the term of this patent is extended or adjusted under 35 U.S.C. 154(b) by 189 days.

(21) Appl. No.: 12/775,475

(22) Filed: May 7, 2010

(65) Prior Publication Data

US 2010/0285405 A1 Nov. 11, 2010

(30) Foreign Application Priority Data

May 7, 2009 (JP) .................... 2009-112756

(51) Int. Cl.
*G03F 7/004* (2006.01)
*G03F 7/028* (2006.01)
*G03F 7/039* (2006.01)

(52) U.S. Cl.
USPC .................. 430/270.1; 430/921; 430/925

(58) Field of Classification Search .............. 430/270.1, 430/326, 910, 921, 925
See application file for complete search history.

(56) References Cited

U.S. PATENT DOCUMENTS

| 5,554,664 | A | 9/1996 | Lamanna et al. | |
|---|---|---|---|---|
| 5,744,537 | A | 4/1998 | Brunsvold et al. | |
| 2006/0276670 | A1 | 12/2006 | Junk et al. | |
| 2007/0269734 | A1 | 11/2007 | Kimura et al. | |
| 2008/0038661 | A1 | 2/2008 | Chiba et al. | |
| 2008/0124656 | A1* | 5/2008 | Kobayashi et al. | 430/286.1 |
| 2009/0202943 | A1* | 8/2009 | Ohsawa et al. | 430/285.1 |
| 2010/0015553 | A1* | 1/2010 | Shimizu et al. | 430/281.1 |
| 2010/0035185 | A1* | 2/2010 | Hagiwara et al. | 430/286.1 |
| 2011/0034721 | A1* | 2/2011 | Hagiwara et al. | 560/117 |

FOREIGN PATENT DOCUMENTS

| EP | 0159428 | 10/1985 | |
|---|---|---|---|
| JP | 6-12452 B2 | 5/1984 | |
| JP | 5-188598 | 7/1993 | |
| JP | 3937466 B2 | 7/1997 | |
| JP | 2004-002252 | 8/2004 | |
| JP | 2005-266766 | 9/2005 | |
| JP | 2006-227632 | 8/2006 | |
| JP | 2007-145803 | 6/2007 | |
| JP | 2008-094835 | 4/2008 | |
| WO | WO 2005-069076 | 7/2005 | |
| WO | WO 2006-035790 | 4/2006 | |
| WO | WO 2008/099869 | * | 8/2008 |
| WO | WO 2009/037981 | * | 3/2009 |

OTHER PUBLICATIONS

Tadatomi Nishikubo et al., "Convenient Syntheses of Cyclic Carbonates by New Reaction of Oxiranes With β-Butyrolactone", Tetrahedron Letters, 1986, pp. 3741-3744, vol. 27, No. 32.
Vincenzo Calo WT al., "Cyclic Carbonate Formation from Carbon Dioxide and Oxiranes in Tetrabutylammonium Halides as Solvents and Catalysts", Organic Letters, 2002, pp. 2561-2563, vol. 4, No. 15.

* cited by examiner

*Primary Examiner* — Anca Eoff
(74) *Attorney, Agent, or Firm* — Ditthavong Mori & Steiner, P.C.

(57) ABSTRACT

A radiation-sensitive resin composition includes a resin, a radiation-sensitive acid generator, an acid diffusion controller, and a mixed solvent. The radiation-sensitive acid generator includes a compound (I) shown by a following general formula (I). The mixed solvent includes about 50 mass % to about 90 mass % of propylene glycol monomethyl ether acetate,

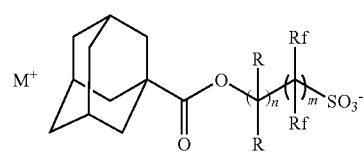

(I)

wherein $M^+$ represents a sulfonium cation or an iodonium cation, R represents a hydrogen atom or a hydrocarbon group having 1 to 8 carbon atoms, Rf represents a fluorine atom or a perfluoroalkyl group having 1 to 4 carbon atoms, n represents an integer from 1 to 10, and m represents an integer from 1 to 4.

4 Claims, No Drawings

RADIATION-SENSITIVE RESIN COMPOSITION

CROSS-REFERENCE TO RELATED APPLICATIONS

The present application claims priority under 35 U.S.C. §119 to Japanese Patent Application No. 2009-112756, filed May 7, 2009. The contents of this application are incorporated herein by reference in their entirety.

BACKGROUND OF THE INVENTION

1. Field of the Invention

The present invention relates to a radiation-sensitive resin composition.

2. Discussion of the Background

A chemically-amplified radiation-sensitive resin composition generates an acid when exposed to deep ultraviolet rays (e.g., KrF excimer laser or ArF excimer laser) or electron beams. A difference in solubility rate in a developer occurs between the exposed area and the unexposed area due to chemical reactions catalyzed by the generated acid so that a resist pattern is formed on a substrate.

A compound that generates a perfluoroalkanesulfonic acid (e.g., trifluoromethanesulfonic acid or nonafluorobutanesulfonic acid) has been used as the acid generator. However, such a compound may remain undecomposed in the environment, or may be accumulated in a human body.

A chemically-amplified resist has been required to have high resolution and form a smooth pattern in order to more accurately control the line width.

Various acid generators have been proposed aimed at adjusting the acidity or changing the diffusion length or the distribution of the acid generated in the resist film (see Japanese Patent Application Publication (KOKAI) No. 2004-002252, Japanese Patent Application Publication (KOKAI) No. 2005-266766, United States Patent Application Publication No. 2006/0276670, Japanese Patent Application Publication (KOKAI) No. 2007-145803, and Japanese Patent Application Publication (KOKAI) No. 2008-094835, for example). A method that utilizes an acid other than sulfonic acid for the chemically-amplified resist as an acid generator has also been proposed (see U.S. Pat. No. 5,554,664 and Japanese Patent No. 3937466). However, the desired performance has not been achieved by such a method.

The above composition exhibits well-balanced resist performance by utilizing acid generators having various structures. However, since the line width of the resist pattern has been reduced to 90 nm or less, various other properties have been required for resist compositions. Specifically, development of a material that satisfies various properties (e.g., line width roughness (LWR), mask error enhancement factor (MEEF), iso-dense bias, and storage stability (changes in foreign matter content and sensitivity with time)) has been desired.

SUMMARY OF THE INVENTION

According to one aspect of the present invention, a radiation-sensitive resin composition includes a resin, a radiation-sensitive acid generator, an acid diffusion controller, and a mixed solvent. The radiation-sensitive acid generator includes a compound (I) shown by a following general formula (I). The mixed solvent includes about 50 mass % to about 90 mass % of propylene glycol monomethyl ether acetate.

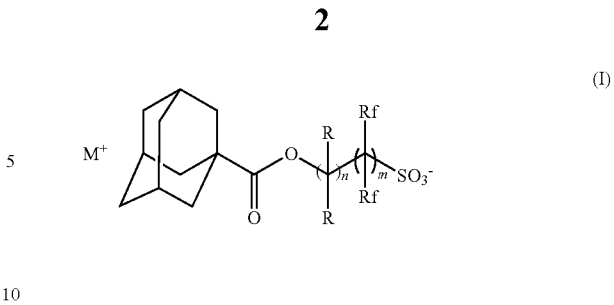

wherein $M^+$ represents a sulfonium cation or an iodonium cation, R represents a hydrogen atom or a hydrocarbon group having 1 to 8 carbon atoms, Rf represents a fluorine atom or a perfluoroalkyl group having 1 to 4 carbon atoms, n represents an integer from 1 to 10, and m represents an integer from 1 to 4.

DESCRIPTION OF THE EMBODIMENTS

Preferred embodiments of the present invention are described in detail below. Note that the present invention is not limited to the following embodiments, but includes any possible embodiments that fall within the scope of the present invention. In the following description, an identical substituent (group) is indicated by an identical symbol, and description thereof is omitted.

The term "group" used herein refers to a group that may be substituted. For example, the term "alkyl group" refers to an unsubstituted alkyl group or an alkyl group in which the hydrogen atom is substituted with a functional group. The term "group" used herein refers to a group that may be branched. For example, the term "alkylcarbonyl group" refers to a linear alkylcarbonyl group or a branched alkylcarbonyl group.

A radiation-sensitive resin composition according to one embodiment of the present invention includes (A) a resin, (B) an acid generator, (C) an acid diffusion controller, and (D) a solvent as essential components, and may further include (E) an additive depending on the application. Each component is described below.

[1] Resin (A)

The resin (A) is preferably an acid-labile group-containing resin that is insoluble or scarcely soluble in an alkaline aqueous solution, but becomes soluble in an alkali developer due to an acid. Examples of the acid-labile group include a group that includes an alkyl ester in which the α-position of the ether bond is a quaternary carbon atom, a group that includes a carboxylate (e.g., alicyclic ester), a group that includes a lactone ring in which the α-position of the ether bond is a quaternary carbon atom, and the like. The term "quaternary carbon atom" refers to a carbon atom that is bonded to a substituent other than a hydrogen atom (i.e., is not bonded to a hydrogen atom). It is preferable that the acid-labile group be a group in which the carbon atom at the α-position of the ether bond is a quaternary carbon atom that is bonded to three carbon atoms. Examples of a repeating unit that includes the acid-labile group include the following repeating unit (a-1).

[1-1] Repeating Unit (a-1)

The resin (A) is preferably a polymer that includes at least one repeating unit (a-1) selected from repeating units shown by the following general formulas (a-1a), (a-1b), and (a-1c).

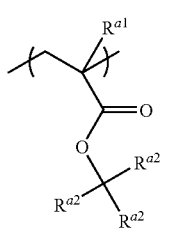
(a-1a)

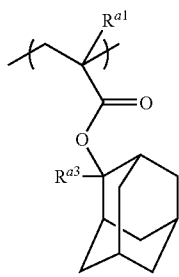
(a-1b)

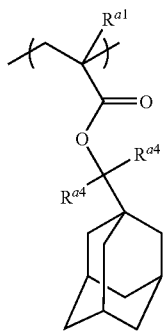
(a-1c)

wherein $R^{a1}$ represents a hydrogen atom, a methyl group, or a trifluoromethyl group, $R^{a2}$ represents an alkyl group having 1 to 10 carbon atoms or a 3- to 10-membered ring formed by bonding of $R^{a2}$ and $R^{a2}$, $R^{a3}$ represents an alkyl group having 1 to 4 carbon atoms, and $R^{a4}$ represents an alkyl group having 1 to 4 carbon atoms.

It is preferable that the repeating unit (a-1a) be any of repeating units shown by the following general formulas (a-1a1) to (a-1a10), and the repeating unit (a-1b) be any of repeating units shown by the following general formulas (a-1b1) to (a-1b3).

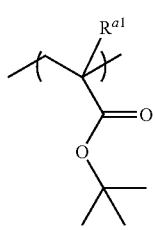
(a-1a1)

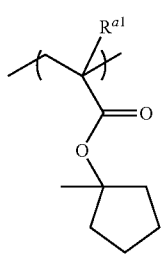
(a-1a2)

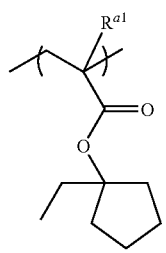
(a-1a3)

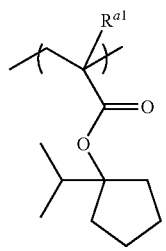
(a-1a4)

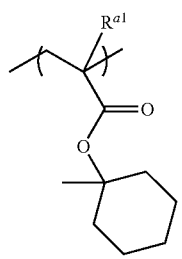
(a-1a5)

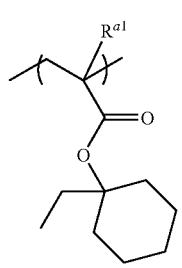
(a-1a6)

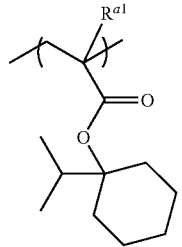
(a-1a7)

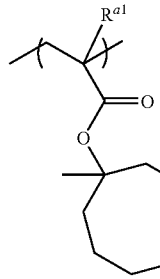
(a-1a8)

-continued

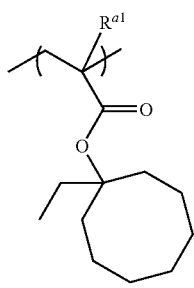
(a-1a9)

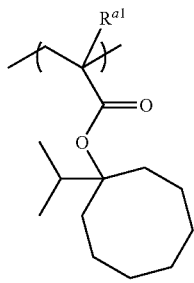
(a-1a10)

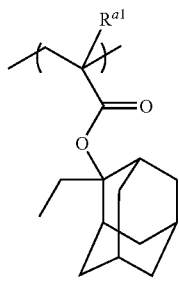
(a-1b1)

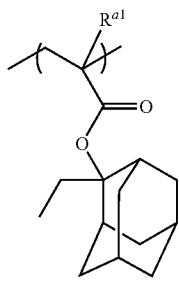
(a-1b2)

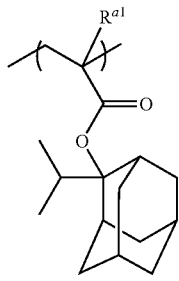
(a-1b3)

Examples of the alkyl group having 1 to 4 carbon atoms represented by $R^{a4}$ in the general formula (a-1c) include linear alkyl groups having 1 to 3 carbon atoms, such as a methyl group, an ethyl group, and an n-propyl group; branched alkyl groups having 3 to 4 carbon atoms, such as an isopropyl group, an isobutyl group, and a t-butyl group; and the like. Among these, a methyl group or an ethyl group is preferable.

Preferable examples of a monomer that produces the repeating unit (a-1c) include 1-(adamantan-1-yl)-1-methylethyl(meth)acrylate, 1-(adamantan-1-yl)-1-ethylethyl(meth)acrylate, 1-(adamantan-1-yl)-1-methylpropyl(meth)acrylate, 1-(adamantan-1-yl)-1-ethylpropyl(meth)acrylate, and the like.

The resin (A) may include only one type of repeating unit (a-1), or may include two or more types of repeating units (a-1). The content of the repeating unit (a-1) in the resin (A) is preferably about 5 mol % to about 80 mol %, more preferably about 10 mol % to about 80 mol %, and particularly preferably about 20 mol % to about 70 mol %, based on the total amount of repeating units that form the resin (A). If the content of the repeating unit (a-1) is more than about 80 mol %, the adhesion of the resulting resist film may decrease, so that pattern collapse or pattern removal may occur.

[1-2] Repeating Unit (a-2)

The resin (A) is preferably a polymer that includes a repeating unit (a-2) that includes a lactone structure.

Examples of the repeating unit (a-2) include repeating units (a-2a) to (a-2p) shown by the following formulas (a-2a) to (a-2p).

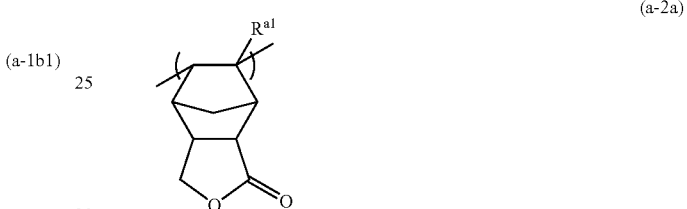
(a-2a)

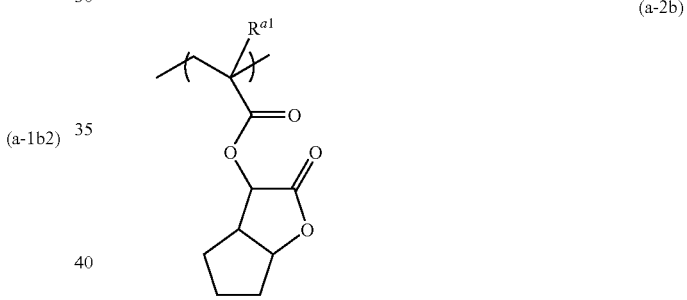
(a-2b)

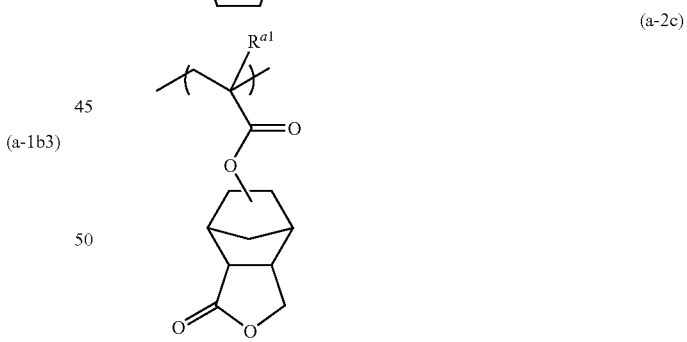
(a-2c)

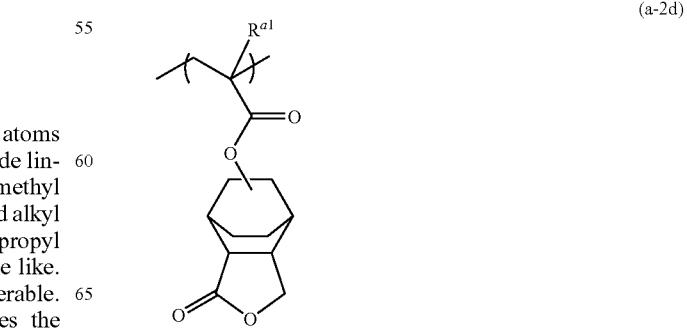
(a-2d)

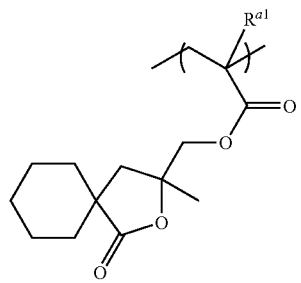 (a-2e)
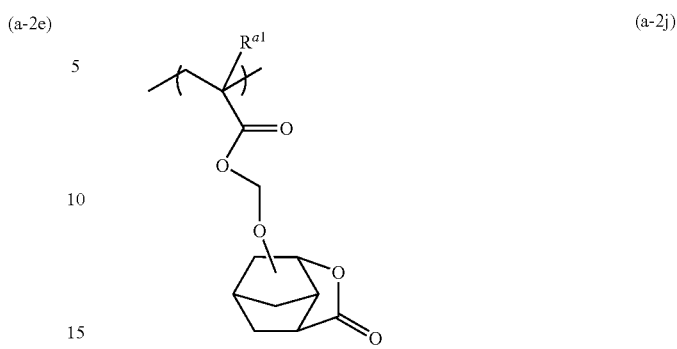 (a-2f) (a-2g) (a-2h) (a-2i)
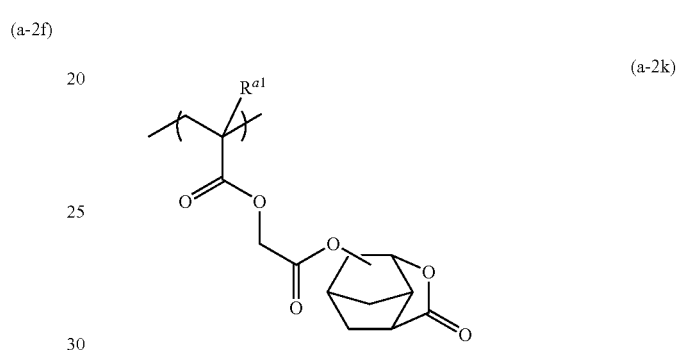 (a-2j) (a-2k)
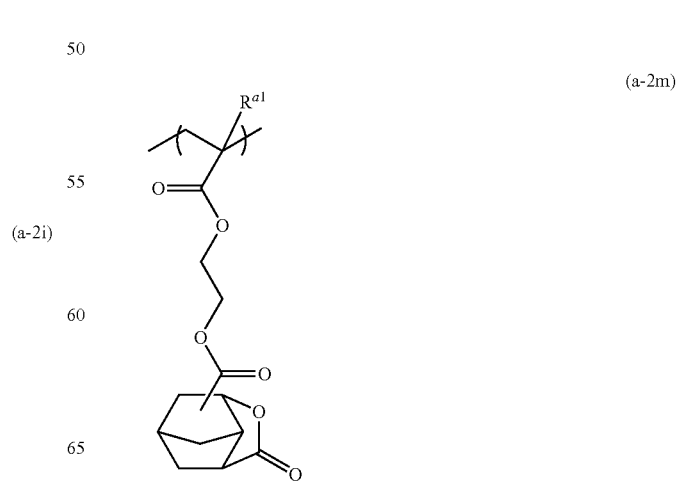 (a-2l) (a-2m)

-continued

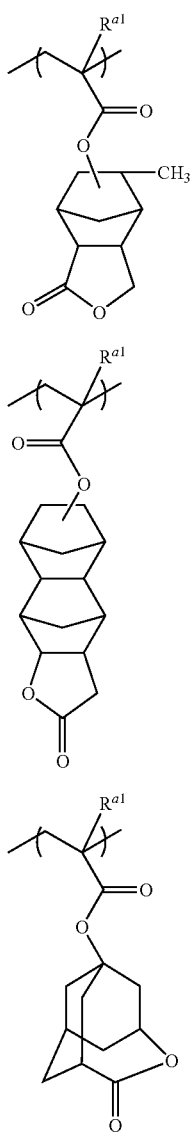

wherein $R^{a1}$ represents a hydrogen atom, a methyl group, or a trifluoromethyl group.

The repeating unit (a-2) is preferably a repeating unit that includes a lactone ring bonded to an alicyclic hydrocarbon group. The repeating unit (a-2b) is an example of a repeating unit that includes a lactone ring bonded to a cyclopentane ring, and the repeating units (a-2e) and (a-2f) are examples of a repeating unit that includes a lactone ring bonded to a cyclohexane ring.

The repeating unit (a-2) is particularly preferably a repeating unit that includes a lactone ring bonded to a polyalicyclic hydrocarbon group. The repeating units (a-2a), (a-2c), and (a-2g) to (a-2m) are examples of a repeating unit that includes a lactone ring bonded to a norbornene ring, and the repeating unit (a-2d) is an example of a repeating unit that includes a bicyclo[2.2.2]octane ring.

Examples of a monomer that produces the repeating unit (a-2) include
5-oxo-4-oxatricyclo[4.2.1.0$^{3,7}$]non-2-yl(meth)acrylate,
9-methoxycarbonyl-5-oxo-4-oxatricyclo[4.2.1.0$^{3,7}$]non-2-yl (meth)acrylate,
5-oxo-4-oxatricyclo[5.2.1.0$^{3,8}$]dec-2-yl(meth)acrylate,
10-methoxycarbonyl-5-oxo-4-oxatricyclo[5.2.1.0$^{3,8}$]non-2-yl(meth)acrylate,
6-oxo-7-oxabicyclo[3.2.1]oct-2-yl(meth)acrylate,
4-methoxycarbonyl-6-oxo-7-oxabicyclo[3.2.1]oct-2-yl (meth)acrylate,
7-oxo-8-oxabicyclo[3.3.1]oct-2-yl(meth)acrylate,
4-methoxycarbonyl-7-oxo-8-oxabicyclo[3.3.1]oct-2-yl (meth)acrylate,
2-oxotetrahydropyran-4-yl(meth)acrylate, 4-methyl-2-oxotetrahydropyran-4-yl(meth)acrylate, 4-ethyl-2-oxotetrahydropyran-4-yl(meth)acrylate,
4-propyl-2-oxotetrahydropyran-4-yl(meth)acrylate, 5-oxotetrahydrofuran-3-yl(meth)acrylate,
2,2-dimethyl-5-oxotetrahydrofuran-3-yl(meth)acrylate,
4,4-dimethyl-5-oxotetrahydrofuran-3-yl(meth)acrylate,
2-oxotetrahydrofuran-3-yl(meth)acrylate, 4,4-dimethyl-2-oxotetrahydrofuran-3-yl(meth)acrylate,
5,5-dimethyl-2-oxotetrahydrofuran-3-yl(meth)acrylate,
2-oxotetrahydrofuran-3-yl(meth)acrylate, 5-oxotetrahydrofuran-2-ylmethyl(meth)acrylate,
3,3-dimethyl-5-oxotetrahydrofuran-2-ylmethyl(meth)acrylate,
4,4-dimethyl-5-oxotetrahydrofuran-2-ylmethyl(meth)acrylate, and the like.

The resin (A) may include only one type of repeating unit (a-2), or may include two or more types of repeating units (a-2). The content of the repeating unit (a-2) in the resin (A) is preferably about 0 mol % to about 90 mol %, more preferably about 0 mol % to about 80 mol %, and particularly preferably about 0 mol % to about 70 mol %, based on the total amount of repeating units that form the resin (A). If the content of the repeating unit (a-2) is more than about 90 mol %, the resolution, LWR, and PEB temperature dependence of the resulting resist may decrease.

[1-3] Repeating Unit (a-3)

The resin (A) is preferably a polymer that includes a repeating unit (a-3) shown by the following general formula (a-3) that includes a carbonate structure.

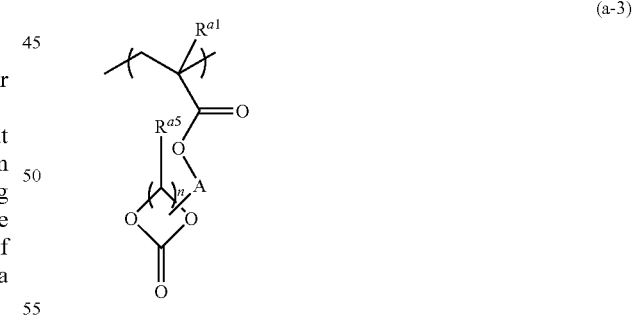

wherein $R^{a1}$ represents a hydrogen atom, a methyl group, or a trifluoromethyl group, $R^{a5}$ represents a hydrogen atom or a chain hydrocarbon group having 1 to 5 carbon atoms, A represents a single bond, a divalent or trivalent chain hydrocarbon group having 1 to 30 carbon atoms, a divalent or trivalent alicyclic hydrocarbon group having 3 to 30 carbon atoms, or a divalent or trivalent aromatic hydrocarbons group having 6 to 30 carbon atoms, provided that a carbon atom included in A and a carbon atom that forms the cyclic carbonate are bonded to form a ring structure when A is a trivalent group, and n represents an integer from 2 to 4.

Preferable examples of the repeating unit (a-3) include repeating units (a-3a) to (a-3v) shown by the following formulas (a-3a) to (a-3v).
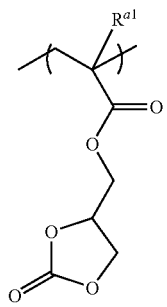
(a-3a)
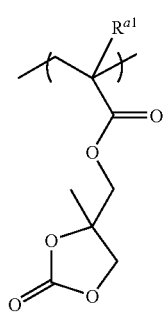
(a-3b)
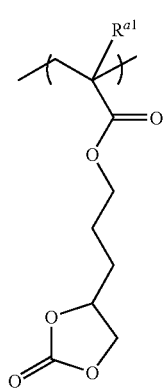
(a-3c)
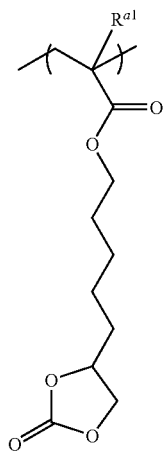
(a-3d)
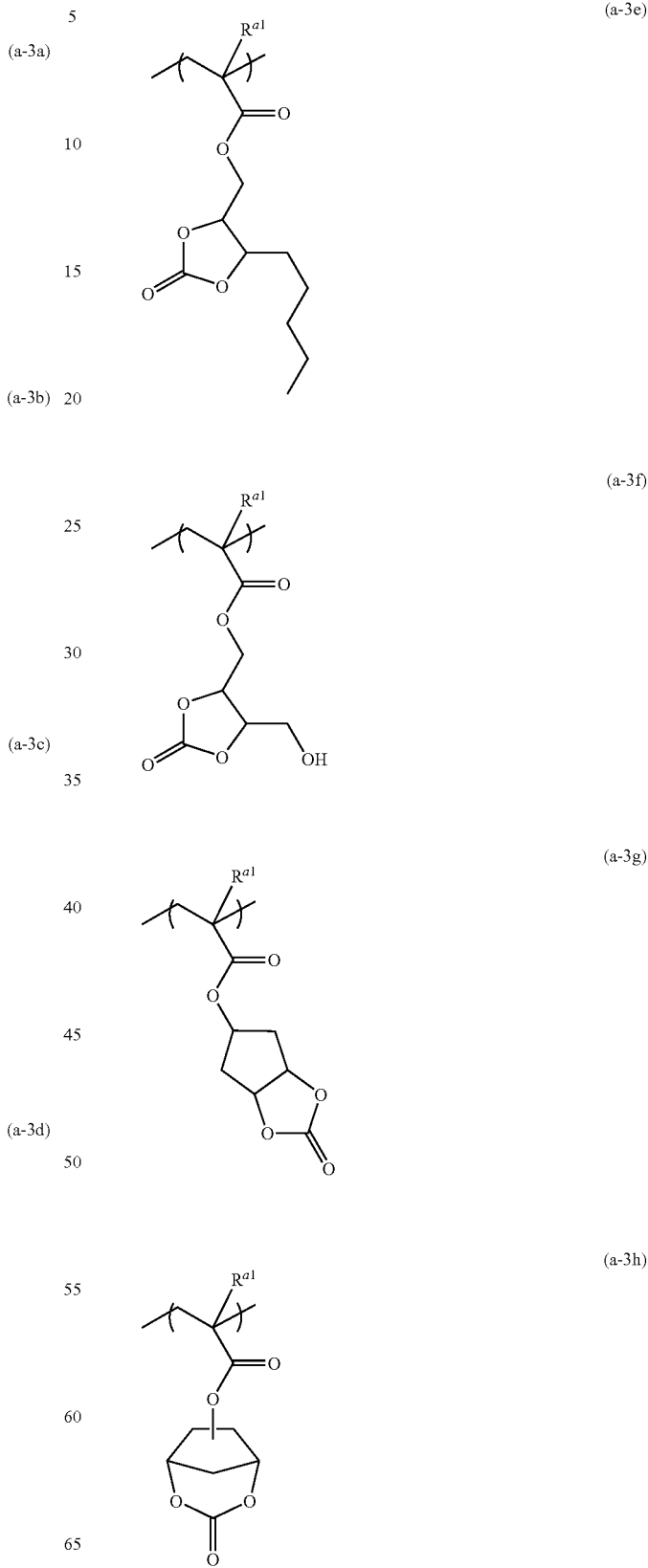
(a-3e)
(a-3f)
(a-3g)
(a-3h)
-continued (a-3i)
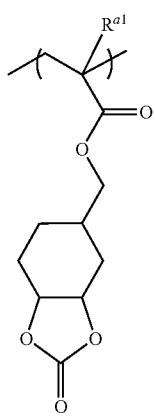
(a-3j)
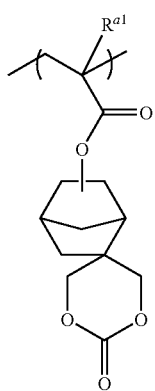
(a-3k)
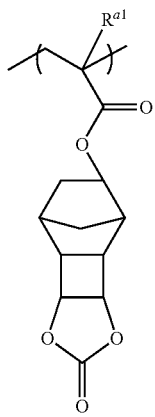
(a-3l)
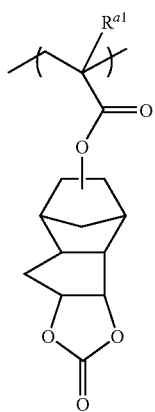
(a-3n)
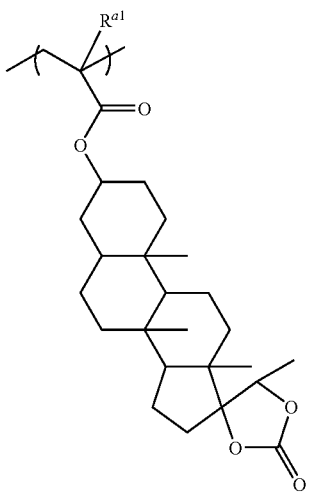
(a-3o)
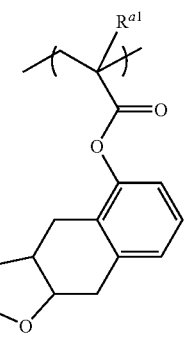
(a-3p)
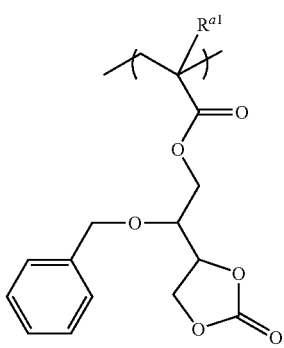
(a-3q)
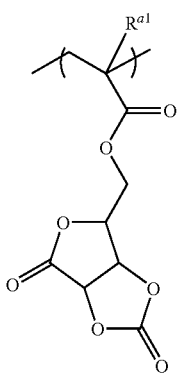

(a-3r)
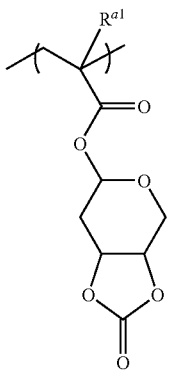

(a-3s)
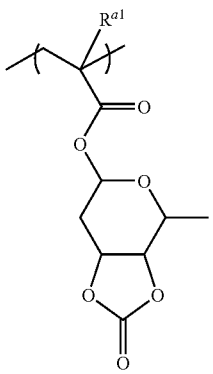

(a-3t)
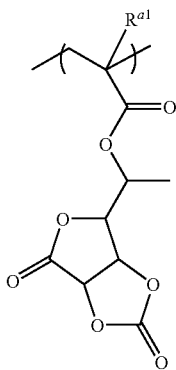

(a-3u)
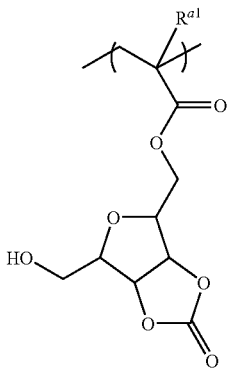

(a-3v)
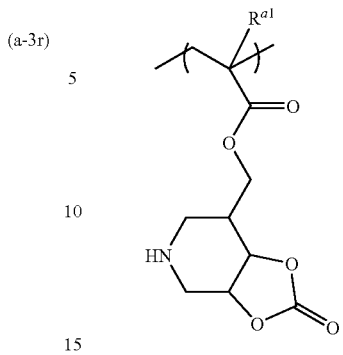

In the general formula (a-3), $R^{a1}$ represents a hydrogen atom, a methyl group, or a trifluoromethyl group. Among these, a methyl group is preferable. $R^{a5}$ represents a hydrogen atom or a chain hydrocarbon group having 1 to 5 carbon atoms. Examples of the chain hydrocarbon group having 1 to 5 carbon atoms include linear alkyl groups having 1 to 5 carbon atoms, such as a methyl group, an ethyl group, a propyl group, and a butyl group; branched alkyl groups having 3 to 5 carbon atoms, such as an isopropyl group, an isobutyl group, and a t-butyl group; and the like.

In the general formula (a-3), n represents an integer from 2 to 4. Specifically, the cyclic carbonate has a 5-membered ring structure when n is 2 (ethylene group), has a 6-membered ring structure when n is 3 (propylene group), and has a 7-membered ring structure when n is 4 (butylene group). The repeating unit (a-3a) is an example of a 5-membered ring structure, and the repeating unit (a-3j) is an example of a 6-membered ring structure.

In the general formula (a-3), A represents a single bond, a divalent or trivalent chain hydrocarbon group having 1 to 30 carbon atoms, a divalent or trivalent alicyclic hydrocarbon group having 3 to 30 carbon atoms, or a divalent or trivalent aromatic hydrocarbons group having 6 to 30 carbon atoms.

When A is a single bond, (1) the oxygen atom of (meth) acrylic acid that forms the polymer is directly bonded to the carbon atom that forms the cyclic carbonate.

The term "chain hydrocarbon group" used herein refers to a hydrocarbon group that does not include a cyclic structure in the main chain, and includes only a chain structure. Examples of the divalent chain hydrocarbon group having 1 to 30 carbon atoms include linear alkylene groups such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; branched alkylene groups such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; and the like. Examples of the trivalent chain hydrocarbon group having 1 to 30 carbon atoms include a group produced by elimination of one hydrogen atom from the above functional group, and the like.

Examples of the structure when A is the chain hydrocarbon group include a structure in which the oxygen atom of (meth)

acrylic acid that forms the polymer is bonded to the carbon atom that forms the cyclic carbonate via a linear alkyl group having 1 to 5 carbon atoms (repeating units (a-3a) to (a-3f)). This structure may include a cyclic structure as a substituent for A (repeating unit (a-3p)).

A carbon atom included in A and a carbon atom that forms the cyclic carbonate may be bonded to form a ring structure. Specifically, the cyclic carbonate may form part of a condensed ring or a spiro ring. A condensed ring is formed when two carbon atoms of the cyclic carbonate are included in the ring structure, and a Spiro ring is formed when only one carbon atom of the cyclic carbonate is included in the ring structure. The repeating units (a-3g), (a-3q), (a-3t), (a-3u), (a-3i), (a-3r), (a-3s), and (a-3v) are examples in which a condensed ring is formed by the carbon atoms included in A and two carbon atoms that form the cyclic carbonate. The repeating unit (a-3j) is an example in which a spiro ring is formed by the carbon atoms included in A and one carbon atom that forms the cyclic carbonate. The ring structure may be a hetero ring (repeating units (a-3q) to (a-3v)).

The term "alicyclic hydrocarbon group" used herein refers to a hydrocarbon group that includes only an alicyclic hydrocarbon structure as a ring structure, and does not include an aromatic ring structure. Note that the alicyclic hydrocarbon group need not necessarily be formed only of an alicyclic hydrocarbon structure, but may include a chain structure.

Examples of the divalent alicyclic hydrocarbon group include monocyclic cycloalkylene groups having 3 to 10 carbon atoms, such as a 1,3-cyclobutylene group, a 1,3-cyclopentylene group, a 1,4-cyclohexylene group, and a 1,5-cyclooctylene group; polycyclic cycloalkylene groups such as a 1,4-norbornylene group, a 2,5-norbornylene group, a 1,5-admantylene group, and a 2,6-admantylene group; and the like. Examples of the trivalent alicyclic hydrocarbon group include a group produced by elimination of one hydrogen atom from the above functional groups, and the like.

Examples of the structure when A is the alicyclic hydrocarbon group include a structure in which the oxygen atom of (meth)acrylic acid that forms the polymer is bonded to the carbon atom that forms the cyclic carbonate via a norbornylane group (repeating units (a-3k) and (a-3l)), a structure in which the oxygen atom of (meth)acrylic acid that forms the polymer is bonded to the carbon atom that forms the cyclic carbonate via a substituted tetradecahydrophenanthryl group (repeating unit (a-3n)), and the like.

The repeating units (a-3k) and (a-3l) are examples in which a condensed ring is formed by the carbon atoms included in A and two carbon atoms that form the cyclic carbonate. The repeating units (a-3j) and (a-3n) are examples in which a Spiro ring is formed by the carbon atoms included in A and one carbon atom that forms the cyclic carbonate.

The term "aromatic hydrocarbon group" used herein refers to a hydrocarbon group that includes an aromatic ring structure. Note that the aromatic hydrocarbon group need not necessarily be formed only of an aromatic ring structure, but may include a chain structure or an alicyclic hydrocarbon structure.

Examples of the divalent aromatic hydrocarbon group include arylene groups such as a phenylene group, a tolylene group, a naphthylene group, a phenanthrylene group, and an anthrylene group, and the like. Examples of the trivalent aromatic hydrocarbon group include a group produced by elimination of one hydrogen atom from the above functional groups, and the like.

Examples of the structure when A is the aromatic hydrocarbon group include a structure in which the oxygen atom of (meth)acrylic acid that forms the polymer is bonded to the carbon atom that forms the cyclic carbonate via a benzylene group (repeating unit (a-3o)), and the like. The repeating unit (a-3o) is an example in which a condensed ring is formed by the carbon atoms included in A and two carbon atoms that form the cyclic carbonate.

The above monomer may be synthesized by the method disclosed in Tetrahedron Letters, Vol. 27, No. 32, p. 3741 (1986), Organic Letters, Vol. 4, No. 15, p. 2561 (2002), or the like.

The resin (A) may include only one type of repeating unit (a-3), or may include two or more types of repeating units (a-3). The content of the repeating unit (a-3) in the resin (A) is preferably about 5 mol % to about 80 mol %, more preferably about 10 mol % to about 70 mol %, and particularly preferably about 10 mol % to about 50 mol %, based on the total amount of repeating units that form the resin (A). If the content of the repeating unit (a-3) is within the above range, the developability, low defectivity, low LWR, low PEB temperature dependence, etc. of the resulting resist can be improved. If the content of the repeating unit (a-3) is less than about 5 mol %, the developability and the low defectivity of the resulting resist may decrease. If the content of the repeating unit (a-3) is more than about 80 mol %, the resolution, low LWR, and low PEB temperature dependence of the resulting resist may decrease.

The term "low defectivity" means that defects rarely occur during a photolithography process. Examples of defects that may occur during a photolithography process include a watermark defect, a blob defect, a bubble defect, and the like. If such defects occur to a large extent during device production, the yield of the devices may significantly decrease.

The term "watermark defect" refers to a phenomenon in which a droplet mark of the immersion liquid remains on the resist pattern. The term "blob defect" refers to a phenomenon in which the resin dissolved in the developer precipitates due to a shock during rinsing and re-adheres to the substrate. The term "bubble defect" refers to a phenomenon in which a change in optical path occurs during liquid immersion lithography due to bubbles contained in the immersion liquid so that the desired pattern is not obtained.

[1-4] Repeating Unit (a-4)

The resin (A) is preferably a polymer that includes a repeating unit (a-4) shown by the following general formula (a-4) that includes a polycyclic cycloalkyl group.

(a-4)

wherein $R^{a1}$ represents a hydrogen atom, a methyl group, or a trifluoromethyl group, and $R^{a6}$ represents a polycyclic cycloalkyl group having 7 to 20 carbon atoms.

Examples of the polycyclic cycloalkyl group having 7 to 20 carbon atoms represented by $R^{a6}$ in the general formula (a-4) include cycloalkyl groups having a polycyclic structure, such as bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, and tricyclo[3.3.1.1$^{3,7}$]decane.

At least one hydrogen atom of the polycyclic cycloalkyl group may be substituted with at least one substituent selected from the group consisting of alkyl groups having 1 to 4 carbon atoms, cycloalkyl groups having 3 to 12 carbon atoms, a hydroxyl group, a cyano group, hydroxyalkyl groups having 1 to 10 carbon atoms, and a carboxyl group.

Examples of the alkyl group having 1 to 4 carbon atoms include linear alkyl groups having 1 to 4 carbon atoms, such as a methyl group, an ethyl group, an n-propyl group, an n-butyl group, a 2-methylpropyl group, a 1-methylpropyl group, and a t-butyl group; branched alkyl groups having 3 to 4 carbon atoms, such as an i-propyl group, a 2-methylpropyl group, a 1-methylpropyl group, and a t-butyl group; and the like. Examples of the cycloalkyl group having 3 to 12 carbon atoms include a cyclopropyl group, a cyclohexyl group, a cyclooctyl group, a cyclododecyl group, and the like.

Examples of a monomer that produces the repeating unit (a-4) include bicyclo[2.2.1]heptyl(meth)acrylate, cyclohexyl (meth)acrylate, bicyclo[4.4.0]decanyl(meth)acrylate, bicyclo[2.2.2]octyl(meth)acrylate, tricyclo[5.2.1.0$^{2,6}$]decanyl (meth)acrylate, tetracyclo[6.2.1.1$^{3,6}$.0$^{2,7}$]dodecanyl(meth) acrylate, tricyclo[3.3.1.1$^{3,7}$]decanyl(meth)acrylate, and the like.

The resin (A) may include only one type of repeating unit (a-4), or may include two or more types of repeating units (a-4). The content of the repeating unit (a-4) in the resin (A) is preferably about 0 mol % to about 30 mol %, and more preferably about 0 mol % to about 25 mol %, based on the total amount of repeating units that form the resin (A). If the content of the repeating unit (a-4) is more than about 30 mol %, the resulting resist film may swell due to an alkaline developer, or the developability of the resulting resist may decrease.

[1-5] Repeating Unit (a-5)

The resin (A) is preferably a polymer that includes a repeating unit (a-5) shown by the following general formula (a-5) that includes a carbon atom bonded to two trifluoromethyl groups and one hydroxyl group.

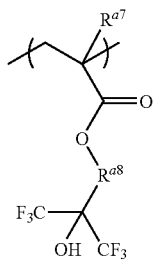

(a-5)

wherein $R^{a7}$ represents a hydrogen atom, an alkyl group having 1 to 4 carbon atoms, a trifluoromethyl group, or a hydroxylmethyl group, and $R^{a8}$ represents a divalent chain hydrocarbon group or a divalent cyclic hydrocarbon group.

Examples of the divalent chain hydrocarbon group represented by $R^{a8}$ in the general formula (a-5) include linear alkylene groups such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; branched alkylene groups such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; and the like.

Examples of the divalent cyclic hydrocarbon group include monocyclic cycloalkylene groups having 3 to 10 carbon atoms, such as a 1,3-cyclobutylene group, 1,3-cyclopentylene group, a 1,4-cyclohexylene group, and a 1,5-cyclooctylene group; polycyclic cycloalkylene groups such as a 1,4-norbornylene group, a 2,5-norbornylene group, a 1,5-admantylene group, and a 2,6-admantylene group; and the like.

The divalent chain hydrocarbon group or the divalent cyclic hydrocarbon group may include an atom other than a carbon atom and a hydrogen atom. For example, an alkylene glycol group, an alkylene ester group, and the like are included within the scope of the divalent chain hydrocarbon group.

Preferable examples of a monomer that produces the repeating unit (a-5) include (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth) acrylate, (1,1,1-trifluoro-2-trifluoromethyl-2-hydroxy-4-pentyl)(meth)acrylate, 2-{[5-(1',1',1'-trifluoro-2'-trifluoromethyl-2'-hydroxy)propyl]bicyclo[2.2.1]heptyl} (meth)acrylate, 3-{[8-(1',1',1'-trifluoro-2'-trifluoromethyl-2'-hydroxy)propyl]tetracyclo[6.2.1.1$^{3,6}$.0$^{2,7}$]dodecyl}(meth) acrylate, and the like.

The resin (A) may include only one type of repeating unit (a-5), or may include two or more types of repeating units (a-5). The content of the repeating unit (a-5) in the resin (A) is preferably about 0 mol % to about 30 mol %, and more preferably about 0 mol % to about 25 mol %, based on the total amount of repeating units that form the resin (A). If the content of the repeating unit (a-5) is more than about 30 mol %, the resulting resist pattern may undergo a top loss phenomenon so that the pattern shape may deteriorate.

[1-6] Repeating Unit (a-6)

The resin (A) is preferably a polymer that includes a repeating unit (a-6) shown by the following general formula (a-6) that includes an adamantane ring structure.

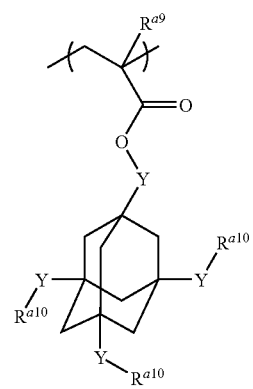

(a-6)

wherein $R^{a9}$ represents a hydrogen atom or a methyl group, Y represents a single bond, a methylene group, or a divalent alkylene group having 2 or 3 carbon atoms, and $R^{a10}$ represents a hydrogen atom, a hydroxyl group, a cyano group, or a COOR$^{a11}$ group (wherein R$^{a11}$ represents a hydrogen atom, an alkyl group having 1 to 4 carbon atoms, or a cycloalkyl group having 3 to 20 carbon atoms).

Examples of the divalent alkylene group having 2 or 3 carbon atoms represented by Y in the general formula (a-6) include divalent linear saturated alkylene groups such as an ethylene group and a propylene group; and the like.

When any of Y in the general formula (a-6) is a single bond to which $R^{a10}$ other than a hydrogen atom is bonded, at least one of the remaining Y is preferably a methylene group or an alkylene group having 2 or 3 carbon atoms.

Examples of the alkyl group having 1 to 4 carbon atoms represented by $R^{a11}$ in the general formula (a-6) include linear alkyl groups having 1 to 3 carbon atoms, such as a methyl group, an ethyl group, and an n-propyl group, branched alkyl groups having 3 to 4 carbon atoms, such as an isopropyl group, an isobutyl group, and a t-butyl group; and the like. Among these, a methyl group or an ethyl group is preferable.

Examples of the cycloalkyl group having 3 to 20 carbon atoms include monocyclic alkyl groups shown by $-C_xH_{2x+1}$ (wherein x is an integer from 3 to 20), such as a cyclopropyl group, a cyclobutyl group, a cyclopentyl group, a cyclohexyl group, a cycloheptyl group, and a cyclooctyl group; polycyclic alkyl groups such as a bicyclo[2.2.1]heptyl group, a tricyclo[5.2.1.0$^{2,6}$]decyl group, a tetracyclo[6.2.1.1$^{3,6}$.0$^{2,7}$]dodecanyl group, and an adamantyl group; a group obtained by substituting some of the hydrogen atoms of the above group with an alkyl group or a cycloalkyl group; and the like.

Preferable examples of a monomer that produces the repeating unit (a-6) include 3-hydroxyadamantan-1-ylmethyl (meth)acrylate, 3,5-dihydroxyadamantan-1-ylmethyl(meth) acrylate, 3-hydroxy-5-methyladamantan-1-yl(meth)acrylate, 3,5-dihydroxy-7-methyladamantan-1-yl(meth)acrylate, 3-hydroxy-5,7-dimethyladamantan-1-yl(meth)acrylate, methyl 3-hydroxy-5,7-dimethyladamantan-1-yl acrylate, and the like.

The resin (A) may include only one type of repeating unit (a-6), or may include two or more types of repeating units (a-6). The content of the repeating unit (a-6) in the resin (A) is preferably about 0 mol % to about 30 mol %, and more preferably about 0 mol % to about 25 mol %, based on the total amount of repeating units that form the resin (A). If the content of the repeating unit (a-6) is more than about 30 mol %, the resulting resist film may swell due to an alkaline developer, or the developability of the resulting resist may decrease.

[1-7] Repeating Unit (a-7)

The polymer that forms the resin (A) may further include a repeating unit (a-7) other than the repeating units (a-1) to (a-6) in order to provide the resin (A) with the desired functions.

Examples of the repeating unit (a-7) include repeating units obtained by cleavage of a polymerizable unsaturated bond of a polyfunctional monomer such as (meth)acrylates having a bridged hydrocarbon skeleton such as dicyclopentenyl(meth)acrylate and methyl adamantyl(meth)acrylate; carboxyl group-containing esters having a bridged hydrocarbon skeleton of unsaturated carboxylic acid such as carboxynorbornyl(meth)acrylate, carboxytricyclodecanyl(meth) acrylate, and carboxytetracycloundecanyl(meth)acrylate;

(meth)acrylates that do not have a bridged hydrocarbon skeleton such as methyl(meth)acrylate, ethyl(meth)acrylate, n-propyl(meth)acrylate, n-butyl(meth)acrylate, 2-methylpropyl(meth)acrylate, 1-methylpropyl(meth)acrylate, t-butyl (meth)acrylate, 2-hydroxyethyl(meth)acrylate, 2-hydroxypropyl(meth)acrylate, 3-hydroxypropyl(meth)acrylate, cyclopropyl(meth)acrylate, cyclopentyl(meth)acrylate, cyclohexyl(meth)acrylate, 4-methoxycyclohexyl(meth)acrylate, 2-cyclopentyloxycarbonylethyl(meth)acrylate, 2-cyclohexyloxycarbonylethyl(meth)acrylate, and 2-(4-methoxycyclohexyl)oxycarbonylethyl(meth)acrylate;

(α-hydroxymethyl)acrylates such as methyl(α-hydroxymethyl)acrylate, ethyl(α-hydroxymethyl)acrylate, n-propyl(α-hydroxymethyl)acrylate, and n-butyl-(α-hydroxymethyl) acrylate; unsaturated nitrile compounds such as (meta) acrylonitrile, α-chloroacrylonitrile, crotonitrile, maleinitrile, fumarnitrile, mesaconitrile, citraconitrile, and itaconitrile; unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-(meth)acryloylmorpholine, N-vinyl-epsilon-caprolactam, N-vinylpyrrolidone, vinylpyridine, and vinylimidazole; unsaturated carboxylic acids (anhydrides) such as (meth) acrylic acid, crotonic acid, maleic acid, maleic anhydride, fumaric acid, itaconic acid, itaconic anhydride, citraconic acid, citraconic anhydride, and mesaconic acid; carboxyl group-containing esters that do not have a bridged hydrocarbon skeleton of unsaturated carboxylic acid such as 2-carboxyethyl(meth)acrylate, 2-carboxypropyl(meth)acrylate, 3-carboxypropyl(meth)acrylate, 4-carboxybutyl(meth)acrylate, and 4-carboxycyclohexyl(meth)acrylate;

polyfunctional monomers such as polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth)acrylate; and polyfunctional monomers that do not have a bridged hydrocarbon skeleton such as methylene glycol di(meth) acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis (2-hydroxypropyl)benzene di(meth)acrylate, and 1,3-bis(2-hydroxypropyl)benzene di(meth)acrylate.

The content of the repeating unit (a-7) in the resin (A) is preferably about 0 mol % to about 50 mol %, and more preferably about 0 mol % to about 40 mol %, based on the total amount of repeating units that form the resin (A).

[1-8] Production Method

A method of producing the resin (A) is described below.

The resin (A) may be synthesized by radical polymerization or the like. For example, the resin (A) is preferably synthesized by (1) polymerizing a monomer while adding a solution containing a monomer and a radical initiator dropwise to a solution containing a reaction solvent or a monomer, (2) polymerizing a monomer while adding a solution containing a monomer and a solution containing a radical initiator dropwise to a solution containing a reaction solvent or a monomer, (3) polymerizing a monomer while adding a plurality of solutions containing different types of monomers and a solution containing a radical initiator dropwise to a solution containing a reaction solvent or a monomer, or the like.

The amount of monomer in the monomer solution that is added to another monomer solution is preferably about 30 mol % or more, more preferably about 50 mol % or more, and particularly preferably about 70 mol % or more, based on the total amount of monomers used for polymerization.

The reaction temperature is appropriately determined depending on the type of initiator. The reaction temperature is normally 30 to 180° C., preferably 40 to 160° C., and more preferably 50 to 140° C. The addition time differs depending on the reaction temperature, the type of initiator, the type of monomer, and the like, but is normally 30 minutes to 8 hours, preferably 45 minutes to 6 hours, and more preferably 1 to 5 hours. The total reaction time including the addition time also differs depending on the reaction conditions, but is normally 30 minutes to 8 hours, preferably 45 minutes to 7 hours, and more preferably 1 to 6 hours.

Examples of the radical initiator used for polymerization include 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis-iso-butylonitrile, 2,2'-azobis(2-methylbutyronitrile), 1,1'-azobis(cyclohexane-1-carbonitrile), 2,2'-azobis(2-methyl-N-phenylpropioneamidine)dihydrochloride, 2,2'-azobis(2-methyl-N-2-propenylpropioneamidine)dihydrochloride, 2,2'-azobis[2-(5-methyl-2-imidazolin-2-yl)propane]dihydrochloride, 2,2'-azobis[2-methyl-N-[1,1-bis(hydroxymethyl)-2-hydroxyethyl]propioneamide], dimethyl-2,2'-azobis(2-methylpropionate), 4,4'-azobis(4-cyanovaleric acid), 2,2'-azobis(2-(hydroxymethyl)propionitrile), and the like. These initiators may be used either individually or in combination.

A solvent that is other than a solvent that hinders polymerization (e.g., nitrobenzene having a polymerization inhibiting effect or a mercapto compound having a chain transfer effect) and dissolves the monomers may be used as the polymerization solvent. Examples of such a solvent include alcohols, ethers, ketones, amides, ester-lactones, nitriles, a mixture of these compounds, and the like.

Examples of the alcohols include methanol, ethanol, propanol, isopropanol, butanol, ethylene glycol, propylene glycol, ethylene glycol monomethyl ether, ethylene glycol monoethyl ether, 1-methoxy-2-propanol, and the like. Examples of the ethers include propyl ether, isopropyl ether, butyl methyl ether, tetrahydrofuran, 1,4-dioxane, 1,3-dioxolane, 1,3-dioxane, and the like.

Examples of the ketones include acetone, methyl ethyl ketone, diethyl ketone, methyl isopropyl ketone, methyl isobutyl ketone, and the like. Examples of the amides include N,N-dimethylformamide, N,N-dimethylacetamide, and the like. Examples of the ester-lactones include ethyl acetate, methyl acetate, isobutyl acetate, γ-butyrolactone, and the like. Examples of the nitriles include acetonitrile, propionitrile, butyronitrile, and the like. These solvents may be used either individually or in combination.

The resin obtained by polymerization is preferably collected by re-precipitation. Specifically, the polymer solution is poured into a re-precipitation solvent after completion of polymerization to collect the target resin as a powder. The above solvents may be used either individually or in combination as the re-precipitation solvent.

The content of low-molecular-weight components derived from monomers in the resin (A) is preferably about 0.1 mass % or less, more preferably about 0.07 mass % or less, and particularly preferably about 0.05 mass % or less, based on the total amount (100 mass %) of the resin (A).

If the content of low-molecular-weight components is about 0.1 mass % or less, it is possible to reduce the amount of elution into water when performing liquid immersion lithography using a resist film produced using the resin (A). Moreover, a situation in which foreign matter precipitates in the resist during storage or uneven resist application occurs can be prevented. This makes it possible to sufficiently suppress occurrence of defects when forming a resist pattern.

The term "low-molecular-weight component derived from monomer" used herein refers to a component having a polystyrene-reduced weight average molecular weight (Mw) determined by gel permeation chromatography (GPC) of 500 or less. Examples of the low-molecular-weight components include monomers, dimers, trimers, oligomers, and the like. The low-molecular-weight components may be removed by chemical purification (e.g., washing with water or liquid-liquid extraction) or a combination of chemical purification and physical purification (e.g., ultrafiltration or centrifugation), for example.

The amount of low-molecular-weight components may be determined by analyzing the resin (A) by high-performance liquid chromatography (HPLC). The content of impurities such as halogens and metals in the resin (A) is preferably as low as possible. The sensitivity, the resolution, the process stability, the pattern shape, etc. of the resulting resist can be further improved by reducing the content of impurities.

The polystyrene-reduced weight average molecular weight (Mw) of the resin (A) determined by gel permeation chromatography (GPC) is preferably about 1000 to about 100,000, more preferably about 1000 to about 30,000, and particularly preferably about 1000 to about 20,000. If the Mw of the resin (A) is less than about 1000, the heat resistance of the resulting resist may decrease. If the Mw of the resin (A) is more than about 100,000, the developability of the resulting resist may decrease.

The ratio (Mw/Mn) of the Mw to the polystyrene-reduced number average molecular weight (Mn) of the resin (A) determined by gel permeation chromatography (GPC) is normally about 1.0 to about 5.0, preferably about 1.0 to about 3.0, and more preferably about 1.0 to about 2.0.

The resins (A) may be used either individually or in combination.

[2] Acid Generator (B)

The acid generator (B) is a radiation-sensitive acid generator that generates an acid upon exposure. The acid generator causes the acid-dissociable group of the resin (A) included in the radiation-sensitive resin composition to dissociate (causes elimination of a protective group) due to an acid generated upon exposure so that the resin (A) becomes alkali-soluble. As a result, the exposed area of the resist film is readily dissolved in an alkaline developer to form a positive-tone resist pattern.

[2-1] Compound (I)

The acid generator (B) includes a compound shown by the general formula (I) as an essential component.

Examples of the hydrocarbon group having 1 to 8 carbon atoms represented by R in the general formula (I) include alkyl groups such as a methyl group, an ethyl group, an n-propyl group, an n-pentyl group, an n-hexyl group, an n-heptyl group, an n-octyl group, an isopropyl group, an isobutyl group, a t-butyl group, a neopentyl group, and a 2-ethylhexyl group; cycloalkyl groups such as a cyclopentyl group and a cyclohexyl group; a phenyl group; and the like. Among these, a methyl group and an ethyl group are preferable. Examples of the perfluoroalkyl group having 1 to 4 carbon atoms represented by Rf include a trifluoromethyl group, a pentafluoroethyl group, a heptafluoropropyl group, and the like. n is an integer from 1 to 10, preferably an integer from 1 to 5, and more preferably 1 or 2, and m is an integer from 1 to 4, preferably 1 or 2, and more preferably 1.

$M^+$ is preferably a sulfonium cation shown by the general formula (II) or (III), or an iodonium cation shown by the general formula (IV), Examples of the alkyl group having 1 to 10 carbon atoms represented by $R^1$ to $R^7$ in the general formulas (II) to (IV) include linear alkyl groups such as a methyl group, an ethyl group, an n-propyl group, an n-pentyl group, an n-hexyl group, an n-heptyl group, an n-octyl group, an n-nonyl group, and an n-decyl group; branched alkyl groups such as an isopropyl group, an isobutyl group, a t-butyl group, a neopentyl group, and a 2-ethylhexyl group; cyclic alkyl groups such as a cyclopentyl group, a cyclohexyl group, and an adamantyl group; and the like. Among these, a methyl group, an ethyl group, an n-butyl group, a t-butyl group, a cyclohexyl group, and the like are preferable.

Examples of the alkoxy group having 1 to 10 carbon atoms represented by $R^1$ to $R^7$ include linear alkoxy groups such as a methoxy group, an ethoxy group, an n-propoxy group, an n-butoxy group, an n-pentyloxy group, an n-hexyloxy group, an n-heptyloxy group, an n-octyloxy group, an n-nonyloxy group, and an n-decyloxy group; branched alkoxyl groups such as an i-propoxy group, a 2-methylpropoxy group, a 1-methylpropoxy group, a t-butoxy group, a neopentyloxy group, and a 2-ethylhexyloxy group; and the like. Among these, a methoxy group, an ethoxy group, an n-propoxy group, an n-butoxy group, and the like are preferable.

Examples of the alkoxycarbonyl group having 2 to 11 carbon atoms represented by $R^1$ to $R^7$ include linear alkoxycarbonyl groups such as a methoxycarbonyl group, an ethoxycarbonyl group, an n-propoxycarbonyl group, an n-butoxycarbonyl group, an n-pentyloxycarbonyl group, an n-hexyloxycarbonyl group, an n-heptyloxycarbonyl group, an n-octyloxycarbonyl group, an n-nonyloxycarbonyl group, and an n-decyloxycarbonyl group; branched alkoxycarbonyl groups such as an i-propoxycarbonyl group, a 2-methylpropoxycarbonyl group, a 1-methylpropoxycarbonyl group, a t-butoxycarbonyl group, a neopentyloxycarbonyl group, and a 2-ethylhexyloxycarbonyl group; and the like. Among these, a methoxycarbonyl group, an ethoxycarbonyl group, an n-butoxycarbonyl group, and the like are preferable.

Preferable examples of the cation in the general formulas (II) to (IV) include a triphenylsulfonium cation, a tri-1-naphthylsulfonium cation, a tri-tert-butylphenylsulfonium cation, a 4-fluorophenyl-diphenylsulfonium cation, a di-4-fluorophenyl-phenylsulfonium cation, a tri-4-fluorophenylsulfonium cation, a 4-cyclohexylphenyl-diphenylsulfonium cation, a 4-methanesulfonylphenyl-diphenylsulfonium cation, a 4-cyclohexanesulfonyl-diphenylsulfonium cation, a 1-naphthyldimethylsulfonium cation, a 1-naphthyldiethylsulfonium cation, a 1-(4-hydroxynaphthyl)dimethylsulfonium cation, a 1-(4-methylnaphthyl)dimethylsulfonium cation, a 1-(4-methylnaphthyl)diethylsulfonium cation, a 1-(4-cyanonaphthyl)dimethylsulfonium cation, a 1-(4-cyanonaphthyl)diethylsulfonium cation, a 1-(3,5-dimethyl-4-hydroxyphenyl)tetrahydrothiophenium cation, a 1-(4-methoxynaphthyl)tetrahydrothiophenium cation, a 1-(4-ethoxynaphthyl)tetrahydrothiophenium cation, a 1-(4-n-propoxynaphthyl)tetrahydrothiophenium cation, a 1-(4-n-butoxynaphthyl)tetrahydrothiophenium cation, a 2-(7-methoxy naphthyl)tetrahydrothiophenium cation, a 2-(7-ethoxynaphthyl)tetrahydrothiophenium cation, a 2-(7-n-propoxynaphthyl)tetrahydrothiophenium cation, a 2-(7-n-butoxynaphthyl)tetrahydrothiophenium cation, and the like.

The acid generator (B) and an additional acid generator may be used in combination in the resin composition according to one embodiment of the present invention. Examples of the additional acid generator include a compound shown by the following general formula (b-1).

$$M^+An^- \quad (b\text{-}1)$$

wherein $M^+$ is the same as $M^+$ in the general formula (I), and $An^-$ represents an anion shown by any of the following formulas (b-2) to (b-5).

$$R^{b1}C_kF_{2k}SO_3^- \quad (b\text{-}2)$$

$$R^{b1}SO_3^- \quad (b\text{-}3)$$

wherein $R^{b1}$ represents a hydrogen atom, a fluorine atom, or a hydrocarbon group having 1 to 12 carbon atoms, and k represents an integer from 1 to 10.

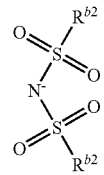

(b-4)

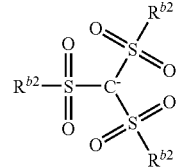

(b-5)

wherein $R^{b2}$ represents a fluoroalkyl group having 1 to 10 carbon atoms or a divalent fluoroalkylene group having 2 to 10 carbon atoms formed by bonding of $R^{b2}$ and $R^{b2}$.

In the general formula (b-2), $-C_kF_{2k}-$ represents a linear or branched perfluoroalkylene group having k carbon atoms. k is preferably 1, 2, 4, or 8.

As the hydrocarbon group having 1 to 12 carbon atoms represented by $R^{b1}$ in the general formulas (b-2) and (b-3), an alkyl group, a cycloalkyl group, and a bridged alicyclic hydrocarbon group having 1 to 12 carbon atoms are preferable. Specific examples include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, a cyclohexyl group, an n-heptyl group, an n-octyl group, a 2-ethylhexyl group, an n-nonyl group, an n-decyl group, a norbornyl group, a norbornylmethyl group, a hydroxynorbornyl group, an adamantyl group, and the like.

Examples of the fluoroalkyl group having 1 to 10 carbon atoms represented by $R^{b2}$ in the general formulas (b-4) and (b-5) include a trifluoromethyl group, a pentafluoroethyl group, a heptafuluoropropyl group, a nonafluorobutyl group, a dodecafluoropentyl group, a perfluorooctyl group, and the like.

Examples of the divalent fluoroalkylene group having 2 to 10 carbon atoms formed by two $R^{b2}$ include a tetrafluoroethylene group, a hexafluoropropylene group, an octafluorobutylene group, a decafluoropentylene group, an undecafluorohexylene group, and the like.

Preferable examples of the anion moiety in the general formula (B-1) include a trifluoromethanesulfonate anion, a perfluoro-n-butanesulfonate anion, a perfluoro-n-octanesulfonate anion, a 2-(bicyclo[2.2.1]hept-2-yl)-1,1,2,2-tetrafluoroethanesulfonate anion, a 2-(bicyclo[2.2.1]hept-2-yl)-1,1-difluoroethanesulfonate anion, a 1-adamantylsulfonate anion, anions shown by the following formulas (b-4a) to (b-4g), and the like.

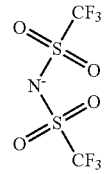

(b-4a)

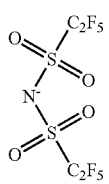
(b-4b)

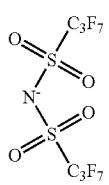
(b-4c)

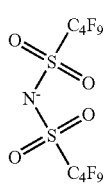
(b-4d)

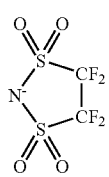
(b-4e)

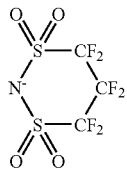
(b-4f)

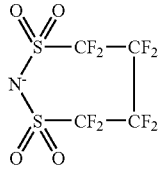
(b-4g)

The acid generator (B) includes the above cation and anion in an arbitrary combination. The acid generators (B) may be used either individually or in combination.

The resin composition according to one embodiment of the present invention may also include an acid generator (i.e., additional acid generator) other than the acid generator (B). Examples of the additional acid generator include onium salt compounds, halogen-containing compounds, diazoketone compounds, sulfone compounds, sulfonic acid compounds, and the like. Specific examples of the additional acid generator are given below.

Examples of the onium salt compounds include an iodonium salt, a sulfonium salt, a phosphonium salt, a diazonium salt, a pyridinium salt, and the like. Specific examples of these onium salt compounds include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, triphenylsulfonium 2-[adamantan-1-yl]-1,1-difluoroethane-1-sulfonate, triphenylsulfonium salicylate, triphenylsulfonium adamantanecarboxylate, triphenylsulfonium 10-camphorsulfonate, triphenylsulfonium 1,1,2,2-tetrafluoro-4-(1-adamantanecarbonyloxy)butane-1-sulfonate, triphenylsulfonium 1,1,2,2-tetrafluoro-6-(1-adamantanecarbonyloxy)hexane-1-sulfonate, cyclohexyl•2-oxocyclohexyl•methylsulfonium trifluoromethanesulfonate, dicyclohexyl•2-oxocyclohexylsulfonium trifluoromethanesulfonate, 2-oxocyclohexyldimethylsulfonium trifluoromethanesulfonate, and the like.

Examples of the halogen-containing compounds include haloalkyl group-containing hydrocarbon compounds, haloalkyl group-containing heterocyclic compounds, and the like. Specific examples of these halogen-containing compounds include (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine; 1,1-bis(4-chlorophenyl)-2,2,2-trichloroethane; and the like.

Examples of the diazoketone compounds include a 1,3-diketo-2-diazo compound, a diazobenzoquinone compound, a diazonaphthoquinone compound, and the like. Specific examples of these diazoketone compounds include 1,2-naphthoquinonediazide-4-sulfonyl chloride, 1,2-naphthoquinonediazide-5-sulfonyl chloride, 2,3,4,4'-tetrahydroxybenzophenone, 1,2-naphthoquinonediazide-4-sulfonate, 1,2-naphthoquinonediazide-5-sulfonate 1,1,1-tris(4-hydroxyphenyl)ethane, 1,2-naphthoquinonediazide-4-sulfonate, 1,2-naphthoquinonediazide-5-sulfonate, and the like.

Examples of the sulfone compounds include beta-ketosulfone, beta-sulfonylsulfone, beta-diazo compounds of these compounds, and the like. Specific examples of these sulfone compounds include 4-trisphenacylsulfone, mesitylphenacylsulfone, bis(phenylsulfonyl)methane, and the like.

Examples of the sulfonic acid compounds include alkyl sulfonates, alkylimide sulfonates, haloalkyl sulfonates, aryl sulfonates, imino sulfonates, and the like.

Specific examples include benzointosylate, pyrogallol tris(trifluoromethanesulfonate), nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanelsulfonylbicyclo[2.2.1]hept-5-ene-2,3-dicarbodiimide, 2-bicyclo[2.2.1]hept-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanelsulfonyloxy)succinimide, N-(2-bicyclo[2.2.1]hept-2-yl-1,1,2,2-tetrafluoroethanesulfonyloxy)succinimide, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate, and the like.

These acid generators may be used either individually or in combination.

The acid generator (B) and the additional acid generator are normally used in a total amount of about 0.1 parts by mass to about 30 parts by mass, and preferably about 0.5 parts by mass to about 20 parts by mass, based on 100 parts by mass of the resin (A), from the viewpoint of ensuring that the resulting resist exhibits excellent sensitivity and developability. If the total amount of the acid generator (B) and the additional acid generator is less than about 0.1 parts by mass, the sensitivity and developability of the resist may decrease. If the total amount of the acid generator (B) and the additional acid generator is more than about 30 parts by mass, the radiation transmittance of the resulting resist may decrease so that a rectangular resist pattern may not be obtained. The additional acid generator is preferably used in an amount of about 80 mass % or less, and more preferably about 60 mass % or less, based on the total amount of the acid generator (B) and the additional acid generator.

[3] Acid Diffusion Controller (C)

The radiation-sensitive resin composition according to one embodiment of the present invention further includes the acid diffusion controller (C) in addition to the polymer (A) and the acid generator (B). The acid diffusion controller (C) controls diffusion of an acid generated by the acid generator upon exposure in a resist film to hinder undesired chemical reactions in the unexposed area. The acid diffusion controller (C) improves the storage stability of the resulting radiation-sensitive resin composition, improves the resolution of the resulting resist, suppresses a change in resist pattern line width due to a change in post-exposure delay (PED) from exposure to post-exposure bake. This enables a composition that exhibits excellent process stability to be obtained.

A nitrogen-containing compound (C-1) shown by the following general formula (C-1) is preferably used as the acid diffusion controller (C).

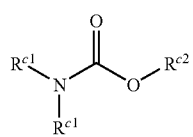

(C-1)

wherein $R^{c1}$ represents a hydrogen atom, a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, or a ring structure formed by bonding of $R^{c1}$ and $R^{c1}$, and $R^{c2}$ represents a hydrogen atom, a monovalent chain hydrocarbon group having 1 to 20 carbon atoms, a monovalent alicyclic hydrocarbon group having 3 to 20 carbon atoms, or a monovalent aromatic hydrocarbon group having 6 to 20 carbon atoms.

The group represented by $R^{c2}$ in the general formula (C-1) is preferably a tert-butyl group or a tert-amyl group.

In the general formula (C-1), $R^{c1}$ and $R^{c1}$ may bond to form a ring structure. For example, a compound in which the nitrogen atom in the general formula (C-1) forms part of a cyclic amine (e.g., N-t-butoxycarbonylpyrrolidine and N-t-butoxycarbonyl-2-phenylbenzimidazole) is included in the nitrogen-containing compound (C-1).

Examples of the nitrogen-containing compound shown by the general formula (C-1) include N-t-butyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N,N'-di-t-butoxycarbonylpiperazine, N,N-di-t-butoxycarbonyl-1-adamantylamine, N,N'-di-t-butoxycarbonyl-N-methyl-1-adamantylamine, N-t-butoxycarbonyl-4,4'-diaminodiphenylmethane, N,N-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminonooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; N-t-amyl group-containing amino compounds such as N-t-amyloxycarbonyldi-n-octylamine, N-t-amyloxycarbonyldi-n-nonylamine, N-t-amyloxycarbonyldi-n-decylamine, N-t-amyloxycarbonyldicyclohexylamine, N-t-amyloxycarbonyl-1-adamantylamine, N-t-amyloxycarbonyl-2-adamantylamine, N-t-amyloxycarbonyl-N-methyl-1-adamantylamine, (S)-(+1-(t-amyloxycarbonyl)-2-pyrrolidinemethanol, (R)-(+)-1-(t-amyloxycarbonyl)-2-pyrrolidinemethanol, N-t-amyloxycarbonyl-4-hydroxypiperidine, N-t-amyloxycarbonylpyrrolidine, N,N'-di-t-amyloxycarbonylpiperazine, N,N-di-t-amyloxycarbonyl-1-adamantylamine, N,N-di-t-amyloxycarbonyl-N-methyl-1-adamantylamine, N-t-amyloxycarbonyl-4,4'-diaminodiphenylmethane, N,N-di-t-amyloxycarbonylhexamethylenediamine, N,N,N'N'-tetra-t-amyloxycarbonylhexamethylenediamine, N,N'-di-t-amyloxycarbonyl-1,7-diaminoheptane, N,N'-di-t-amyloxycarbonyl-1,8-diaminonooctane, N,N'-di-t-amyloxycarbonyl-1,9-diaminononane, N,N'-di-t-amyloxycarbonyl-1,10-diaminodecane, N,N'-di-t-amyloxycarbonyl-1,12-diaminododecane, N,N'-di-t-amyloxycarbonyl-4,4'-diaminodiphenylmethane, N-t-amyloxycarbonylbenzimidazole, N-t-amyloxycarbonyl-2-methylbenzimidazole, and N-t-amyloxycarbonyl-2-phenylbenzimidazole; and the like.

Among these, N-t-butoxycarbonyl dicyclohexylamine, N-t-butoxycarbonyl-1-adamantylamine, N-t-butoxycarbonyl-2-adamantylamine, (S)-(+1-(t-butoxycarbonyl)-2-pyrrolidinemethanol, (R)-(+)-1-(t-butoxycarbonyl)-2-pyrrolidinemethanol, N-t-butoxycarbonylpyrrolidine, N-t-butoxycarbonyl-4-hydroxypiperidine, N-t-butoxycarbonyl-2-phenylbenzimidazole, N-t-amyloxycarbonyl dicyclohexylamine, N-t-amyloxycarbonyl-1-adamantylamine, N-t-amyloxycarbonyl-2-adamantylamine, (S)-(−)-1-(t-amyloxycarbonyl)-2-pyrrolidinemethanol, (R)-(+)-1-(t-amyloxycarbonyl)-2-pyrrolidinemethanol, N-t-amyloxycarbonylpyrrolidine, N-t-amyloxycarbonyl-4-hydroxypiperidine, and N-t-amyloxycarbonyl-2-phenylbenzimidazole are preferable, with N-t-butoxycarbonyldicyclohexylamine, (R)-(+)-1-(t-butoxycarbonyl)-2-pyrrolidinemethanol, N-t-butoxycarbonylpyrrolidine, N-t-butoxycarbonyl-4-hydroxypiperidine, and N-t-butoxycarbonyl-2-phenylbenzimidazole being more preferable.

Examples of the acid diffusion controller (C) other than the nitrogen-containing compound (C-1) include nitrogen-containing compounds such as tertiary amine compounds, quaternary ammonium hydroxide compounds, and nitrogen-containing heterocyclic compounds, photo-destructible basic compounds, and the like.

Examples of the tertiary amine compounds include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyl dimethylamine, dicyclohexyl methylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, and 2,6-diisopropylaniline; alkanolamines such as triethanolamine and N,N-di(hydroxyethyl)aniline; N,N,N',N'-tetramethylethylenediamine, N,N,N',N'-tetrakis(2-hydroxypropyl)ethylenediamine, 1,3-bis[1-(4-aminophenyl)-1-methylethyl]benzene tetramethylenediamine, bis(2-dimethylaminoethyl)ether, bis(2-diethylaminoethyl)ether, and the like.

Examples of the quaternary ammonium hydroxide compounds include tetra-n-propyl ammonium hydroxide, tetra-n-butylammonium hydroxide, and the like.

Examples of the nitrogen-containing heterocyclic compounds include pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, 1,4-diazabicyclo[2.2.2]octane, imidazole, 4-methylimidazole, 1-benzyl-2-methylimidazole, 4-methyl-2-phenylimidazole, benzimidazole, 2-phenylbenzimidazole, N-t-butoxycarbonylbenzimidazole, N-t-butoxycarbonyl-2-methylbenzimidazole, N-t-butoxycarbonyl-2-phenylbenzimidazole, and the like.

The term "photo-destructible basic compound" refers to an onium salt compound that loses its basicity (i.e., acid-diffusion controllability) upon decomposition due to exposure. Specific examples of the onium salt compounds include a sulfonium salt compound shown by the following formula (C-2) and an iodonium salt compound shown by the following formula (C-3).

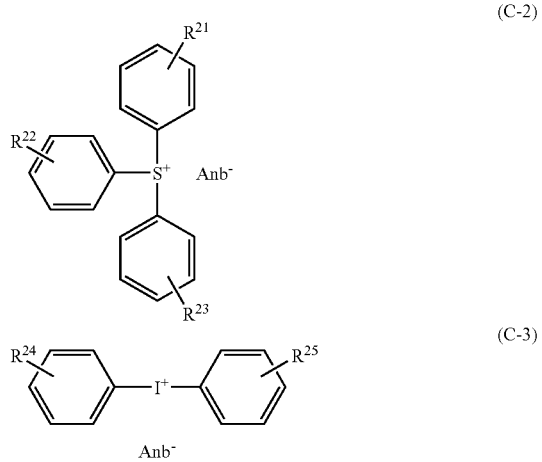

wherein $R^{21}$ to $R^{25}$ represent a hydrogen atom, an alkyl group, an alkoxy group, a hydroxyl group, or a halogen atom, and $Anb^-$ represents $OH^-$, $R^{26}COO^-$, $R^{26}SO_3^-$ (wherein $R^{26}$ represents an alkyl group, an aryl group, or an alkanol group), or an anion shown by the following formula (c).

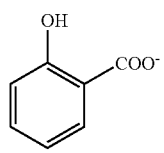

Specific examples of the sulfonium salt compound and the iodonium salt compound include triphenylsulfonium hydrooxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl)iodonium 10-camphorsulfonate, diphenyliodonium 10-camphorsulfonate, triphenylsulfonium 10-camphorsulfonate, 4-t-butoxyphenyl diphenylsulfonium 10-camphorsulfonate, and the like.

The acid diffusion controllers (C) may be used either individually or in combination.

The acid diffusion controller (C) is preferably used in an amount of less than about 10 parts by mass, and more preferably less than about 5 parts by mass, based on 100 parts by mass of the resin (A), in order to provide the resulting resist with high sensitivity. If the amount of the acid diffusion controller (C) is more than about 10 parts by mass, the sensitivity of the resist may decrease to a large extent. If the amount of the acid diffusion controller (C) is less than about 0.001 parts by mass, the pattern shape and the dimensional accuracy of the resulting resist may decrease depending on the process conditions.

[4] Solvent (D)

The solvent (D) includes about 50 mass % to about 90 mass % of propylene glycol monomethyl ether acetate.

If the content of propylene glycol monomethyl ether acetate is less than about 50 mass %, the applicability may deteriorate so that striation or the like may occur. If the content of propylene glycol monomethyl ether acetate is more than about 90 mass %, the storage stability of the radiation-sensitive composition may deteriorate.

The solvent (D) further includes a sub-solvent (D-I). Any solvent that can dissolve the resin (A), the acid generator (B), the acid diffusion controller (C), and optionally the additive (E) may be used as the sub-solvent (D-I).

Examples of the sub-solvent (D-I) include propylene glycol monoalkyl ether acetates such as propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; cyclic ketones such as cyclopentanone, 3-methylcyclopentanone, cyclohexanone, 2-methylcyclohexanone, 2,6-dimethylcyclohexanone, and isophorone; ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, dimethylene glycol di-n-propyl ether, dimethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and the like.

Among these, propylene glycol monoalkyl ethers, ketones, alkyl 2-hydroxypropionates, alkyl 3-alkoxypropionates, γ-butyrolactone, and the like are preferable. These solvents may be used either individually or in combination.

[5] Additive (E)

The additive (E) such as a fluorine-containing resin, an alicyclic skeleton-containing resin, a surfactant, or a sensitizer may optionally be added to the radiation-sensitive resin composition according to one embodiment of the present invention. The amount of each additive may be appropriately determined depending on the application.

The fluorine-containing resin provides water repellency to the surface of the resulting resist film during liquid immersion lithography. The fluorine-containing resin suppresses elusion of components from the resist film into an immersion solution, or suppresses defects (e.g., watermark defect) that may occur due to liquid immersion lithography even if high-speed scan is performed.

The structure of the fluorine-containing resin is not particularly limited. Examples of the fluorine-containing resin include (1) a fluorine-containing resin that is insoluble in a developer, but becomes alkali-soluble due to an acid, (2) a fluorine-containing resin that is soluble in a developer, and becomes more alkali-soluble due to an acid, (3) a fluorine-containing resin that is insoluble in a developer, and becomes alkali-soluble due to an alkali, (4) a fluorine-containing resin that is soluble in a developer, and becomes more alkali-soluble due to an alkali, and the like.

The fluorine-containing resin is preferably a polymer that includes at least one repeating unit selected from the repeating unit (a-5) and the following fluorine-containing repeating units, and more preferably a polymer that includes at least one repeating unit selected from the group consisting of the repeating units (a-1) to (a-4), (a-6), and (a-7).

Examples of the fluorine-containing repeating unit include trifluoromethyl(meth)acrylate, 2,2,2-trifluoroethyl(meth)acrylate, perfluoroethyl(meth)acrylate, perfluoro-n-propyl(meth)acrylate, perfluoro-i-propyl(meth)acrylate, perfluoro-n-butyl(meth)acrylate, perfluoro-i-butyl(meth)acrylate, perfluoro-t-butyl(meth)acrylate, perfluorocyclohexyl(meth)acrylate, 2-(1,1,1,3,3,3-hexafluoro)propyl(meth)acrylate, 1-(2,2,3,3,4,4,5,5-octafluoro)pentyl(meth)acrylate, 1-(2,2,3,3,4,4,5,5-octafluoro)hexyl(meth)acrylate, perfluorocyclohexylmethyl(meth)acrylate, 1-(2,2,3,3,3-pentafluoro)propyl(meth)acrylate, 1-(2,2,3,3,4,4,4-heptafluoro)pentyl(meth)acrylate, 1-(3,3,4,4,5,5,6,6,7,7,8,8,9,9,10,10,10-heptadecafluoro)decyl(meth)acrylate, 1-(5-trifluoromethyl-3,3,4,4,5,6,6,6-octafluoro)hexyl(meth)acrylate, and the like.

Preferable examples of the fluorine-containing resin include polymers shown by the following general formulas (E-1a) to (E-1k), and the like. These fluorine-containing resins may be used either individually or in combination.

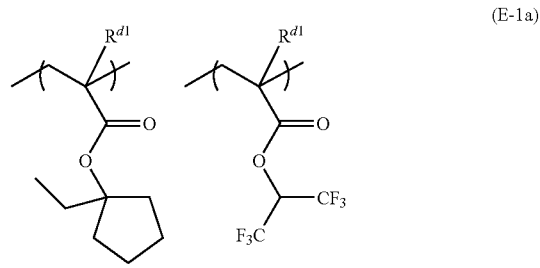

(E-1a)

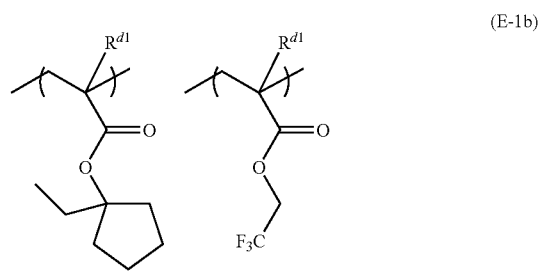

(E-1b)

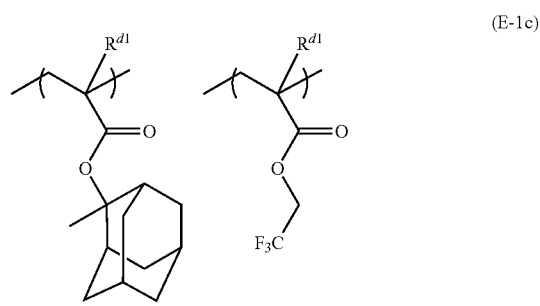

(E-1c)

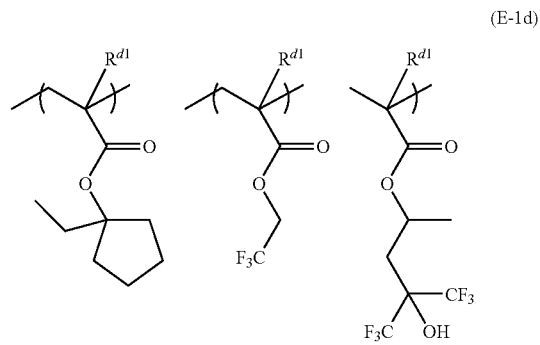

(E-1d)

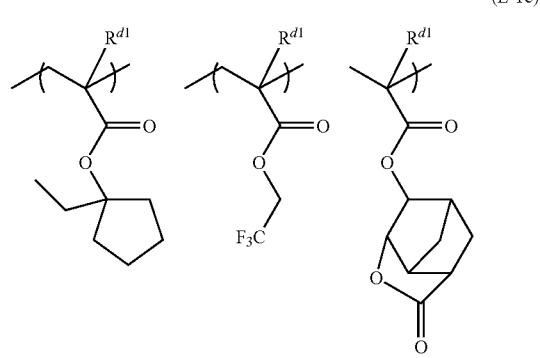

(E-1e)

The alicyclic skeleton-containing resin further improves the dry etching resistance, the pattern shape, adhesion to a substrate, and the like.

Examples of the alicyclic skeleton-containing resin include adamantane derivatives such as 1-adamantanecarboxylic acid, 2-adamantanon, t-butyl 1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl- 5-oxo-4-oxa-tricyclo[4.2.1.0$^{3,7}$]nonane, and the like. These alicyclic skeleton-containing resins may be used either individually or in combination.

The surfactant improves applicability, striation, developability, and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate, commercially available products such as "KP341" (manufactured by Shin-Etsu Chemical Co., Ltd.), "Polyflow No. 75", "Polyflow No. 95" (manufactured by Kyoeisha Chemical Co., Ltd.), "EFTOP EF301", "EFTOP EF303", "EFTOP EF352" (manufactured by JEMCO, Inc.), "MEGAFAC F171", "MEGAFAC F173" (manufactured by Dainippon Ink and Chemicals, Inc.), "Fluorad FC430", "Fluorad FC431" (manufactured by Sumitomo 3M Ltd.), "Asahi Guard AG710", "Surflon S-382", "Surflon SC-101", "Surflon SC-102", "Surflon SC-103", "Surflon SC-104", "Surflon SC-105", "Surflon SC-106" (manufactured by Asahi Glass Co., Ltd.), and the like. These surfactants may be used either individually or in combination.

The sensitizer absorbs the energy of radiation, and transmits the energy to the acid generator (B) to increase the amount of acid generated upon exposure. The sensitizer thus improves the apparent sensitivity of the radiation-sensitive resin composition.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination.

A dye, a pigment, an adhesion improver, or the like may also be used as the additive (E). For example, a dye or a pigment visualizes the latent image in the exposed area so that the effect of halation during exposure can be reduced. An adhesion improver improves the adhesion to a substrate. Examples of other additives include an alkali-soluble resin, a low-molecular-weight alkali-solubility controller having an acid dissociable protecting group, a halation inhibitor, a preservation stabilizer, an anti-foaming agent, and the like.

The additives (E) may be used either individually or in combination.

[6] Method of Forming Photoresist Pattern

The radiation-sensitive resin composition according to one embodiment of the present invention is useful as a chemically-amplified resist. When using the radiation-sensitive resin composition as a chemically-amplified resist, the acid-dissociable group of the resin component (mainly the resin (A)) dissociates due to an acid generated by the acid generator upon exposure to produce a carboxyl group. As a result, the solubility of the exposed area of the resist in an alkaline developer increases. Therefore, the exposed area is dissolved and removed by the alkaline developer to obtain a positive-tone photoresist pattern.

A method of forming a photoresist pattern according to one embodiment of the present invention includes (1) forming a photoresist film on a substrate using the radiation-sensitive resin composition (hereinafter may be referred to as "step (1)"), (2) applying radiation to the photoresist film via a mask having a given pattern (optionally via an immersion medium) (exposure) (hereinafter may be referred to as "step (2)"), and (3) developing the exposed photoresist film to form a photoresist pattern (hereinafter may be referred to as "step (3)").

When performing liquid immersion lithography, a protective film that is insoluble in the immersion liquid may be formed on the resist film before performing the step (2) so that the immersion liquid does not directly come in contact with the resist film. A solvent removal-type protective film that is removed by a solvent prior to the step (3) (see Japanese Patent Application Publication (KOKAI) No. 2006-227632, for example), or a developer removal-type protective film that is removed during development in the step (3) (see WO2005-069076 and WO2006-035790, for example) may be used as the protective film. It is preferable to use the developer removal-type protective film from the viewpoint of throughput.

In the step (1), a resin composition solution obtained by dissolving the radiation-sensitive resin composition in a solvent is applied to a substrate (e.g., silicon wafer or wafer coated with silicon dioxide) by an appropriate application method (e.g., rotational coating, cast coating, or roll coating) to form a photoresist film. Specifically, the resist composition solution is applied so that the resulting resist film has a given thickness, and pre-baked (PB) to volatilize the solvent in the film to obtain a resist film.

The thickness of the resist film is not particularly limited, but is preferably 0.1 to 5 µm, and more preferably 0.1 to 2 µm.

The PB temperature is determined depending on the composition of the radiation-sensitive resin composition, but is preferably 30 to 200° C., and more preferably 50 to 150° C.

When forming a photoresist pattern using the radiation-sensitive resin composition according to one embodiment of the present invention, an organic or inorganic antireflective film may be formed on the substrate to bring out the potential of the radiation-sensitive resin composition to a maximum extent (see Japanese Examined Patent Publication (KOKOKU) No. 6-12452, for example). A protective film may be formed on the photoresist film to prevent an adverse effect of basic impurities, etc. contained in the environmental atmosphere (see Japanese Patent Application Publication (KOKAI) No. 5-188598, for example). The above immersion liquid protective film may also be formed on the photoresist film. These methods may be used in combination.

In the step (2), the photoresist film formed by the step (1) is exposed to radiation (optionally via an immersion medium such as water). In this case, radiation is applied through a mask having a given pattern.

Radiation used for exposure is appropriately selected from visible rays, ultraviolet rays, deep ultraviolet rays, X-rays, charged particle rays, and the like depending on the type of acid generator. It is preferable to use deep ultraviolet rays such as ArF excimer laser light (wavelength: 193 nm) or KrF excimer laser light (wavelength: 248 nm). It is particularly preferable to use ArF excimer laser light.

The exposure conditions (e.g., dose) are appropriately determined depending on the composition of the radiation-sensitive resin composition, the type of additive, and the like. It is preferable to perform post-exposure bake (PEB) after exposure. The acid-dissociable group of the resin component smoothly dissociates by performing PEB. The PEB temperature is determined depending on the composition of the radiation-sensitive resin composition, but is preferably 30 to 200° C., and more preferably 50 to 170° C.

In the step (3), the exposed photoresist film is developed using a developer to form a given photoresist pattern. After development, the photoresist film is normally washed with water, and dried.

An alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water is preferably used as the developer. The concentration of the alkaline aqueous solution is normally about 10 mass % or less. If the concentration of the alkaline aqueous solution exceeds about 10 mass %, the unexposed area may be dissolved in the developer.

The developer may be a mixture prepared by adding an organic solvent to the above alkaline aqueous solution. Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methyl alcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like. These organic solvents may be used either individually or in combination.

The organic solvent is preferably used in an amount of about 100 parts by volume or less based on 100 parts by volume of the alkaline aqueous solution. If the amount of the organic solvent exceeds about 100 parts by volume, a decrease in developability may occur so that the exposed area may remain undeveloped. An appropriate amount of surfactant or the like may be added to the developer.

EXAMPLES

The present invention is further described below by way of examples. Note that the present invention is not limited to the following examples. In the examples and comparative examples, the units "parts" and "%" respectively refer to "parts by mass" and "mass %", unless otherwise indicated. The following property value measuring methods and property evaluation methods were used.

Mw, Mn, and Mw/Mn

The Mw and the Mn of each polymer were measured by gel permeation chromatography (GPC) using GPC columns (manufactured by Tosoh Corp., G2000HXL×2, G3000HXL×1, G4000HXL×1) (standard: monodisperse polystyrene, flow rate: 1.0 ml/min, eluant: tetrahydrofuran, column temperature: 40° C.). The dispersity (Mw/Mn) was calculated from the Mw and Mn measurement results.

$^{13}$C-NMR Analysis

Each polymer was subjected to $^{13}$C-NMR analysis using a spectrometer ("JNM-ECX400" manufactured by JEOL Ltd.).

Residual Rate of Low-Molecular-Weight Components

The residual rate of low-molecular-weight components was measured by high-performance liquid chromatography (HPLC) using "Intersil ODS-25 μm column" (manufactured by GL Sciences Inc., 4.6 mm (diameter)×250 mm) at a flow rate of 1.0 ml/min using an acrylonitrile/0.1% phosphoric acid aqueous solution as an eluant. Note that the term "low-molecular-weight component" refers to a component that mainly contains a monomer and has a molecular weight of less than 1000.

Synthesis of Resin (A)

The following monomers (M-1) to (M-8) were used to synthesize resins (A-1) to (A-8).

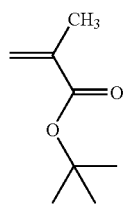

(M-1)

-continued

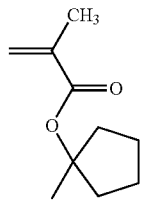

(M-2)

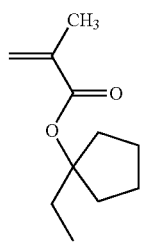

(M-3)

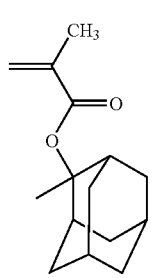

(M-4)

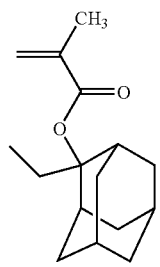

(M-5)

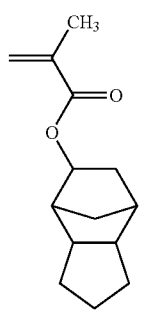

(M-6)

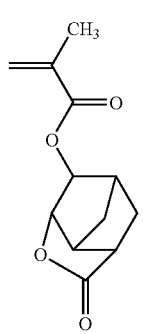

(M-7)

-continued

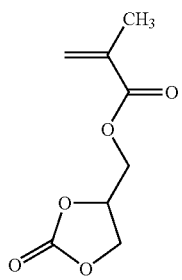

(M-8)

Synthesis Example 1

Resin (A-1)

A monomer solution was prepared by dissolving 9.42 g (25 mol %) of the monomer (M-1), 11.14 g (25 mol %) of the monomer (M-2), and 29.44 g (50 mol %) of the monomer (M-7) in 100 g of 2-butanone, and adding 2.175 g of dimethyl 2,2'-azobis(2-methylpropionate) to the solution.

A 500 ml three-necked flask equipped with a thermometer and a dropping funnel was charged with 50 g of 2-butanone, and purged with nitrogen for 30 minutes. The inside of the flask was then heated to 80° C. with stirring using a magnetic stirrer. The monomer solution was added dropwise to the flask using the dropping funnel over three hours. The monomers were polymerized for six hours from the start of the addition of the monomer solution. After completion of polymerization, the polymer solution was cooled with water to 30° C. or less. The polymer solution was then added to 1000 g of methanol, and a precipitated white powder was collected by filtration. The white powder was washed twice with 200 g of methanol in a slurry state. The white powder was then collected by filtration, and dried at 50° C. for 17 hours to obtain a white powdery copolymer (resin (A)) (33.5 g, yield: 67%). The resulting copolymer is referred to as a resin (A-1).

The copolymer had an Mw of 6800 and an Mw/Mn ratio of 1.35. As a result of $^{13}$C-NMR analysis, it was found that the ratio of repeating units derived from the monomers (M-1), (M-2), and (M-7) contained in the copolymer was 24:23:53 (mol %). The residual rate of low-molecular-weight components in the copolymer was 0.04 mass %. The measurement results are shown in Table 1.

Synthesis Examples 2 to 6

Resins (A-2) to (A-6)

Resins (A-2) to (A-6) were synthesized in the same manner as in Synthesis Example 1, except for changing the composition as shown in Table 1.

The measurement results for the ratio (mol %) of the repeating units determined by $^{13}$C-NMR analysis, yield (%), Mw, and dispersity (Mw/Mn) of the resins (A-2) to (A-6) are shown in Table 1.

(Preparation of Radiation-Sensitive Resin Compositions)

Tables 2-1 and 2-2 show the composition of the radiation-sensitive resin composition prepared in each example and comparative example. The components (acid generator (B), acid diffusion controller (C), and solvent (D)) of the radiation-sensitive composition other than the resins (A-1) to (A-5) synthesized in the synthesis examples are given below.

<Acid Generator (B)>

(B-1): Triphenylsulfonium 2-(adamantane-1-carbonyloxy)-1,1-difluoroethanesulfonate (B-2): 1-(4-n-Butoxynaphthalen-1-yl)tetrahydrothiophenium 2-(adamantane-1-carbonyloxy)-1,1-difluoroethanesulfonate (B-3): 4-Cyclohexyldiphenyldiphenylsulfonium 2-(adamantane-1-carbonyloxy)-1,1-difluoroethanesulfonate (B-4): Triphenylsulfonium 2-adamantane-1,1-difluoroethanesulfonate (B-I): 4-Cyclohexylphenyldiphenylsulfonium nonafluoro-n-butanesulfonate (B-II): 1-(4-n-Butoxynaphthalen-1-yl)tetrahydrothiophenium nonafluoro-n-butanesulfonate (B-III): 4-Cyclohexylphenyl nonafluoro-n-butanesulfonate (B-IV): Triphenylsulfonium (adamantan-1-ylmethoxycarbonyl)-difluoromethanesulfonate <Acid Diffusion Controller (C)>

(C-1): N-t-Butoxycarbonyl-4-hydroxypiperidine (C-2): (R)-(+)-1-(t-butoxycarbonyl)-2-piperidinemethanol (C-3): N-t-Butoxycarbonylpyrrolidine (C-4): N-t-Butoxycarbonyl-2-phenylbenzimidazole (C-5): Tri-n-octylamine (C-6): Phenyldiethanolamine (C-7): Compound shown by the following formula

TABLE 1

| Resin A | Raw material monomer ratio (mol %)/ monomer ratio in polymer (mol %) | | | | | | | | Mw | Mw/Mn | Yield (%) |
| | M-1 | M-2 | M-3 | M-4 | M-5 | M-6 | M-7 | M-8 | | | |
|---|---|---|---|---|---|---|---|---|---|---|---|
| A-1 | 25 | 25 | — | — | — | — | 50 | — | 6800 | 1.35 | 67 |
|  | 24 | 24 |  |  |  |  | 52 |  |  |  |  |
| A-2 | — | — | 35 | 35 | — | — | 30 | — | 5100 | 1.7 | 63 |
|  |  |  | 34 | 33 |  |  | 33 |  |  |  |  |
| A-3 | — | — | 40 | — | — | 10 | 50 | — | 7300 | 1.69 | 78 |
|  |  |  | 39 |  |  | 8 | 53 |  |  |  |  |
| A-4 | — | 30 | — | — | 10 | — | 50 | 10 | 6400 | 1.54 | 80 |
|  |  | 28 |  |  | 6 |  | 54 | 12 |  |  |  |
| A-5 | — | — | — | 50 | — | — | 50 | — | 6600 | 1.55 | 78 |
|  |  |  |  | 44 |  |  | 56 |  |  |  |  |
| A-6 | — | — | 15 | 45 | — | — | 20 | 20 | 3600 | 1.25 | 62 |
|  |  |  | 15 | 44 |  |  | 21 | 20 |  |  |  |

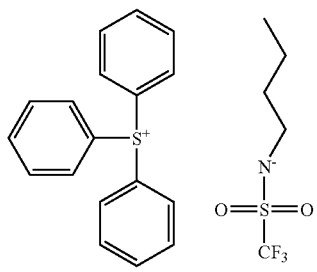 [SMILES: c1ccc([S+](c2ccccc2)c2ccccc2)cc1 ; CCCC[N-]S(=O)(=O)C(F)(F)F]

<Solvent (D)>

(D-1): Propylene glycol monomethyl ether acetate
(D-2): Cyclohexanone
(D-3): γ-Butyrolactone
(D-4): 2-Heptanone
(D-5): Propylene glycol monomethyl ether
(D-6): Ethyl 2-hydroxypropionate

TABLE 2-1

|  |  | Resin (parts) | Acid generator (parts) | Acid diffusion controller (parts) | Solvent (parts) | Ratio of D-1 (wt %) |
|---|---|---|---|---|---|---|
| Example | 1 | A-1 (100) | B-1 (8.6) | C-1 (0.7) | D-1 (1500), D-2 (650), D-3 (40) | 68.5 |
|  | 2 | A-2 (100) | B-3 (10.0) | C-2 (0.7) | D-1 (1500), D-2 (650), D-3 (40) | 68.5 |
|  | 3 | A-3 (100) | B-1 (5.6) B-2 (6.0) | C-3 (1.0) | D-1 (1500), D-2 (650), D-3 (40) | 68.5 |
|  | 4 | A-4 (100) | B-1 (8.6) | C-4 (0.7) | D-1 (1500), D-2 (650), D-3 (40) | 68.5 |
|  | 5 | A-5 (100) | B-1 (8.6) | C-5 (0.7) | D-1 (1500), D-2 (650), D-3 (40) | 68.5 |
|  | 6 | A-5 (100) | B-3 (10.0) | C-6 (0.7) | D-1 (1500), D-2 (650), D-3 (40) | 68.5 |
|  | 7 | A-5 (100) | B-3 (10.0) | C-6 (0.7) | D-1 (1970), D-4 (220) | 90 |
|  | 8 | A-5 (100) | B-3 (10.0) | C-6 (0.7) | D-1 (1970), D-5 (220) | 90 |
|  | 9 | A-5 (100) | B-3 (10.0) | C-6 (0.7) | D-1 (1100), D-6 (1090) | 50 |
|  | 10 | A-5 (100) | B-1 (8.6) | C-2 (0.7) | D-1 (1100), D-6 (1090) | 50 |
|  | 11 | A-6 (100) | B-1 (8.6) | C-7 (2.1) | D-1 (1500), D-2 (650), D-3 (30) | 65.5 |
|  | 12 | A-6 (100) | B-1 (6.5)/B-4 (2) | C7 (2.1) | D-1 (1500), D-2 (650), D-3 (30) | 65.5 |

TABLE 2-2

|  |  | Resin (parts) | Acid generator (parts) | Acid diffusion controller (parts) | Solvent (parts) | Ratio of D-1 (wt %) |
|---|---|---|---|---|---|---|
| Comparative Example | 1 | A-1 (100) | B-I (7) | C-1 (0.7) | D-1 (1500), D-2 (650), D-3 (40) | 68.5 |
|  | 2 | A-2 (100) | B-III (10.0) | C-2 (0.7) | D-1 (1500), D-2 (650), D-3 (40) | 68.5 |
|  | 3 | A-3 (100) | B-I (5.6) B-II (6.0) | C-3 (1.0) | D-1 (1500), D-2 (650), D-3 (40) | 68.5 |
|  | 4 | A-4 (100) | B-I (8.6) | C-4 (0.7) | D-1 (1500), D-2 (650), D-3 (40) | 68.5 |
|  | 5 | A-5 (100) | B-I (8.6) | C-5 (0.7) | D-1 (1500), D-2 (650), D-3 (40) | 68.5 |
|  | 6 | A-5 (100) | B-III (10.0) | C-6 (0.7) | D-1 (1500), D-2 (650), D-3 (40) | 68.5 |
|  | 7 | A-5 (100) | B-3 (10.0) | C-6 (0.7) | D-1 (2190) | 100 |
|  | 8 | A-5 (100) | B-3 (10.0) | C-6 (0.7) | D-1 (650), D-2 (1500), D-3 (40) | 30 |
|  | 9 | A-5 (100) | B-3 (10.0) | C-6 (0.7) | D-1 (800), D-6 (1390) | 36.5 |
|  | 10 | A-5 (100) | B-IV (8.6) | C-2 (0.6) | D-1 (1100), D-6 (1090) | 50 |
|  | 11 | A-6 (100) | B-I (7) | C-7 (2.1) | D-1 (1500), D-2 (650), D-3 (30) | 65.5 |

Example 1

100 parts by mass of the resin (A-1) obtained in Synthesis Example 1, 8.6 parts by mass of triphenylsulfonium 2-(adamantane-1-carbonyloxy)-1,1-difluoroethanesulfonate (B-1) (acid generator (B)), and 0.7 parts by mass of N-t-butoxycarbonyl-4-hydroxypiperidine (C-1) (acid diffusion controller (C)) were mixed. 1500 parts by mass of propylene glycol monomethyl ether acetate (D-1) and 650 parts by mass of cyclohexanone (D-2) (solvent (D)) were added to the mixture to obtain a mixed solution. The resulting mixed solution was filtered through a filter with a pore size of 0.20 μm to obtain a radiation-sensitive resin composition. Tables 2-1 and 2-2 show the composition of the radiation-sensitive resin composition.

Examples 2 to 12 and Comparative Examples 1 to 11

Radiation-sensitive resin compositions (Examples 2 to 12 and Comparative Examples 1 to 11) were obtained in the same manner as in Example 1, except for changing the components as shown in Tables 2-1 and 2-2.

Evaluation Method

The sensitivity, LWR, MEEF, iso-dense bias, sensitivity stability, and foreign matter increase rate of the radiation-sensitive resin compositions of Examples 1 to 12 and Comparative Examples 1 to 11 were evaluated using an ArF excimer laser as a light source. The evaluation results are shown in Tables 3-1 and 3-2.

(1) Sensitivity (mJ/cm$^2$)

An underlayer anti-reflective film having a thickness of 77 nm was formed on the surface of an 8-inch silicon wafer (substrate) using "ARC29A" (manufactured by Nissan Chemical Industries, Ltd.). The radiation-sensitive resin composition of each example and comparative example was spin-coated onto the surface of the substrate, and soft-baked (SB) for 60 seconds on a hot plate at a temperature shown in Tables 2-1 and 2-2 to form a resist film having a thickness of 120 nm.

The resist film was exposed via a mask pattern using a full-field projection aligner ("S306C" manufactured by Nikon Corp., NA: 0.78). After performing PEB for 60 seconds at a temperature shown in Tables 2-1 and 2-2, the resist film was developed using a 2.38 mass % tetramethylammonium hydroxide aqueous solution (hereinafter referred to as "TMAH aqueous solution") at 25° C. for 60 seconds, washed with water, and dried to form a positive-tone resist pattern.

An optimum dose (mJ/cm$^2$) at which a 1:1 line-and-space (1L/1S) pattern having a line width of 90 nm was formed via a 1:1 line-and-space mask having a line width of 90 nm was taken as sensitivity. The measurement was carried out using a scanning electron microscope ("S-9220" manufactured by Hitachi High-Technologies Corporation).

(2) LWR (nm)

A 90 nm 1L/1S pattern resolved at the optimum dose was observed from above using the scanning electron microscope. The line width was measured at arbitrary ten points, and a variation (3σ) in measured values was taken as LWR. A case where the LWR was 8.0 nm or less was evaluated as "Good"; and a case where the LWR was more than 8.0 nm was evaluated as "Bad".

(3) MEEF

The dimension of a pattern resolved at the optimum dose using each mask (85.0 nmL/180 nmP, 87.5 nmL/180 nmP, 90.0 nmL/180 nmP, 92.5 nmL/180 nmP, 95.0 nmL/180 nmP) was measured using the scanning electron microscope. The mask size (horizontal axis) and the line width (vertical axis) were plotted on a graph, and the slope of the graph was determined by a least-square method, and taken as MEEF. A case where the MEEF was 4.0 or more was evaluated as "Good"; and a case where the MEEF was less than 4.0 was evaluated as "Bad".

(4) Iso-Dense Bias

The difference in line width between a line pattern formed by exposing a line-and-space pattern (1L1S) at the optimum dose and a line pattern formed by exposing a line-and-space pattern (1L10S) at the optimum dose was taken as iso-dense bias. A case where the iso-dense bias was less than 50 nm was evaluated as "Good"; and a case where the iso-dense bias was 50 nm or more was evaluated as "Bad".

(5) Sensitivity Stability

The sensitivity (mJ/cm$^2$) was measured immediately after preparation (initial) and after storage at 5° C. for 3 months (after storage at 5° C. for 3 months) using the above method. A case where the sensitivity measured after storage for 3 months differed from the initial sensitivity within the range of ±2% was evaluated as "Good"; and a case where the sensitivity measured after storage for 3 months differed from the initial sensitivity outside the range of ±2% was evaluated as "Bad".

(6) Foreign Matter Increase Rate

The number of foreign matters having a particle size of 0.15 μm or more contained in 10 ml of the resist composition was measured immediately after preparation (initial) and after storage at 5° C. for 3 months (after storage at 5° C. for 3 months) using a particle sensor ("KS-41" manufactured by Rion). A case where the foreign matter increase rate was 200 or less was evaluated as "Good"; and a case where the foreign matter increase rate was more than 200 was evaluated as "Bad".

TABLE 3-1

| | | SB (° C.) | PEB (° C.) | Sensitivity (mJ/cm$^2$) | LWR | MEEF | Iso-dense bias | Sensitivity stability | Foreign matter increase rate |
|---|---|---|---|---|---|---|---|---|---|
| Example | 1 | 100 | 120 | 40 | Good | Good | Good | Good | Good |
| | 2 | 100 | 100 | 41 | Good | Good | Good | Good | Good |
| | 3 | 100 | 105 | 38 | Good | Good | Good | Good | Good |
| | 4 | 120 | 105 | 42 | Good | Good | Good | Good | Good |
| | 5 | 100 | 110 | 39 | Good | Good | Good | Good | Good |
| | 6 | 100 | 110 | 43 | Good | Good | Good | Good | Good |
| | 7 | 100 | 110 | 44 | Good | Good | Good | Good | Good |
| | 8 | 100 | 110 | 44 | Good | Good | Good | Good | Good |
| | 9 | 100 | 110 | 44 | Good | Good | Good | Good | Good |
| | 10 | 100 | 110 | 45 | Good | Good | Good | Good | Good |
| | 11 | 100 | 90 | 43 | Good | Good | Good | Good | Good |
| | 12 | 100 | 90 | 50 | Good | Good | Good | Good | Good |

TABLE 3-2

|  |  | SB (° C.) | PEB (° C.) | Sensitivity (mJ/cm²) | LWR | MEEF | Iso-dense bias | Sensitivity stability | Foreign matter increase rate |
|---|---|---|---|---|---|---|---|---|---|
| Comparative Example | 1 | 100 | 120 | 35 | Bad | Bad | Bad | Good | Bad |
| | 2 | 100 | 100 | 38 | Good | Bad | Bad | Good | Good |
| | 3 | 100 | 105 | 33 | Bad | Bad | Bad | Bad | Good |
| | 4 | 120 | 105 | 39 | Bad | Bad | Bad | Bad | Good |
| | 5 | 100 | 110 | 37 | Bad | Bad | Bad | Good | Good |
| | 6 | 100 | 110 | 40 | Bad | Bad | Bad | Bad | Good |
| | 7 | 100 | 110 | 40 | Good | Good | Good | Bad | Bad |
| | 8 | 100 | 110 | 39 | Good | Good | Good | Bad | Bad |
| | 9 | 100 | 110 | 40 | Bad | Good | Good | Bad | Bad |
| | 10 | 100 | 110 | 47 | Good | Good | Bad | Good | Bad |
| | 11 | 100 | 90 | 40 | Good | Bad | Bad | Good | Good |

As is clear from Tables 3-1 and 3-2, it was confirmed that the resist performance (e.g., LWR, MEEF, iso-dense bias, and storage stability) is improved when using the radiation-sensitive resin composition according to the embodiment of the present invention.

The above radiation-sensitive resin composition exhibits low LWR, a small MEEF, a small iso-dense bias, and excellent storage stability. The above radiation-sensitive resin composition may be suitably used as a lithography material when using a KrF excimer laser or an ArF excimer laser as a light source. The above radiation-sensitive resin composition may also be used for liquid immersion lithography.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A radiation-sensitive resin composition comprising:
   a resin essentially consisting of at least one repeating unit selected from the group consisting of a repeating unit shown by a general formula (a-1a), a repeating unit shown by a general formula (a-1b), a repeating unit shown by a general formula (a-1c), a repeating unit including a lactone structure, a repeating unit shown by a general formula (a-3), a repeating unit shown by a general formula (a-4), and a repeating unit shown by a general formula (a-5);
   a radiation-sensitive acid generator that comprises a compound (I) shown by a following general formula (I);
   an acid diffusion controller; and
   a mixed solvent that includes about 50 mass % to about 90 mass % of propylene glycol monomethyl ether acetate,

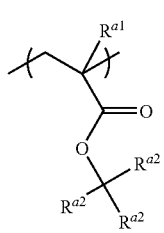

(a-1a)

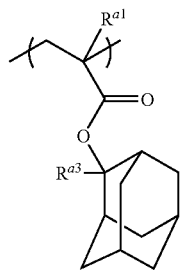

(a-1b)

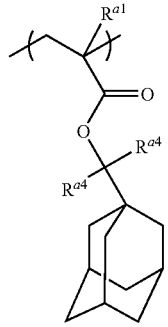

(a-1c)

wherein $R^{a1}$ represents a hydrogen atom, a methyl group, or a trifluoromethyl group; each $R^{a2}$ represents an alkyl group having 1 to 10 carbon atoms, or two $R^{a2}$s are bonded to form a 3- to 10-membered unsubstituted hydrocarbon ring and $R^{a2}$ other than the two $R^{a2}$s represents an alkyl group having 1 to 10 carbon atoms; and $R^{a3}$ represents an alkyl group having 1 to 4 carbon atoms; and each $R^{a4}$ represents an alkyl group having 1 to 4 carbon atoms,

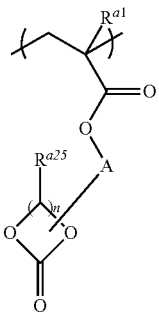

(a-3)

wherein $R^{a1}$ represents a hydrogen atom, a methyl group, or a trifluoromethyl group; $R^{a5}$ represents a hydrogen atom or a chain hydrocarbon group having 1 to 5 carbon atoms; A represents a single bond, a divalent or trivalent chain hydrocarbon group having 1 to 30 carbon atoms, a divalent or trivalent alicyclic hydrocarbon group having 3 to 30 carbon atoms, or a divalent or trivalent aromatic hydrocarbons group having 6 to 30 carbon atoms, wherein a carbon atom included in A and a carbon atom that forms the cyclic carbonate are bonded to form a ring structure when A is a trivalent group; and n represents an integer from 2 to 4,

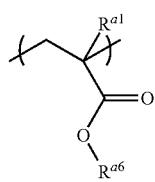

(a-4)

wherein $R^{a1}$ represents a hydrogen atom, a methyl group, or a trifluoromethyl group; and $R^{a6}$ represents an unsubstituted polycyclic cycloalkyl group having 7 to 20 carbon atoms,

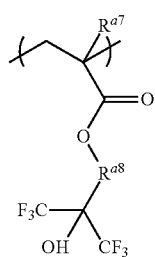

(a-5)

wherein $R^{a7}$ represents a hydrogen atom, an alkyl group having 1 to 4 carbon atoms, a trifluoromethyl group, or a hydroxylmethyl group; and $R^{a8}$ represents a divalent chain hydrocarbon group or a divalent cyclic hydrocarbon group,

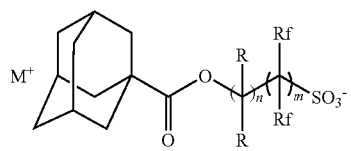

(I)

wherein $M^+$ represents a sulfonium cation or an iodonium cation, R represents a hydrogen atom or an unsubstituted hydrocarbon group having 1 to 8 carbon atoms, Rf represents a fluorine atom or a perfluoroalkyl group having 1 to 4 carbon atoms, n represents an integer from 1 to 10, and m represents an integer from 1 to 4.

2. The radiation-sensitive resin composition according to claim 1, wherein $M^+$ represents a sulfonium cation shown by a following general formula (II) or (III), or represents an iodonium cation shown by a following general formula (IV),

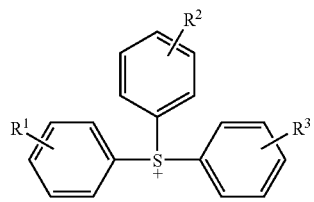

(II)

wherein $R^1$, $R^2$, and $R^3$ represent a hydrogen atom, a fluorine atom, a hydroxyl group, an alkyl group having 1 to 10 carbon atoms, an alkoxy group having 1 to 10 carbon atoms, or an alkoxycarbonyl having 2 to 11 carbon atoms,

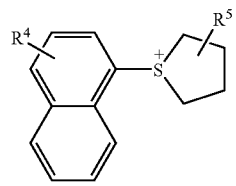

(III)

wherein $R^4$ and $R^5$ represent a hydrogen atom, a fluorine atom, a hydroxyl group, an alkyl group having 1 to 10 carbon atoms, an alkoxy group having 1 to 10 carbon atoms, or an alkoxycarbonyl group having 2 to 11 carbon atoms,

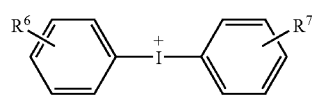

(IV)

wherein $R^6$ and $R^7$ represent a hydrogen atom, a fluorine atom, a hydroxyl group, an alkyl group having 1 to 10 carbon atoms, an alkoxy group having 1 to 10 carbon atoms, or an alkoxycarbonyl group having 2 to 11 carbon atoms.

3. The radiation-sensitive resin composition according to claim 1, wherein the acid diffusion controller comprises a compound shown by a following general formula (C-1),

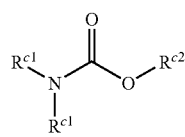

(C-1)

wherein $R^{c1}$ represents a hydrogen atom, a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, or a ring structure formed by bonding of $R^{c1}$ and $R^{c1}$, and wherein $R^{c2}$ represents a hydrogen atom, a monovalent chain hydrocarbon group having 1 to 20 carbon atoms, a monovalent alicyclic hydrocarbon group having 3 to 20 carbon atoms, or a monovalent aromatic hydrocarbon group having 6 to 20 carbon atoms.

4. The radiation-sensitive resin composition according to claim 1, wherein R represents a hydrogen atom.

* * * * *